US007222275B2

(12) United States Patent
Satou

(10) Patent No.: US 7,222,275 B2
(45) Date of Patent: May 22, 2007

(54) TEST APPARATUS AND WRITING CONTROL CIRCUIT

(75) Inventor: Hiroshi Satou, Tokyo (JP)

(73) Assignee: Advantest Corporation, Tokyo (JP)

( * ) Notice: Subject to any disclaimer, the term of this patent is extended or adjusted under 35 U.S.C. 154(b) by 314 days.

(21) Appl. No.: 10/938,407

(22) Filed: Sep. 10, 2004

(65) Prior Publication Data
US 2005/0102570 A1 May 12, 2005

(30) Foreign Application Priority Data
Sep. 12, 2003 (JP) ............................. 2003-322093

(51) Int. Cl.
G01R 31/28 (2006.01)
(52) U.S. Cl. ...................... 714/724; 714/744
(58) Field of Classification Search ................ 714/738, 714/744
See application file for complete search history.

(56) References Cited

U.S. PATENT DOCUMENTS 6,754,868 B2 * 6/2004 Bristow et al. ............. 714/744
6,785,858 B2 * 8/2004 Niiro ......................... 714/744

FOREIGN PATENT DOCUMENTS

| JP | 3-18951 | 1/1991 |
| JP | 5-127850 | 5/1993 |
| JP | 11-304888 | 11/1999 |
| JP | 2001-512255 | 8/2001 |

OTHER PUBLICATIONS

Japanese International Search Report and Written Opinion dated Dec. 28, 2004 (7 pages).
Patent Abstracts of Japan; Publication No. 05-127850 dated May 25, 1993 (1 page).
Patent Abstracts of Japan; Publication No. 03-018951 dated Jan. 28, 1991 (1 page).
Patent Abstracts of Japan; Publication No. 11-304888 dated Nov. 5, 1999 (1 page).

* cited by examiner

Primary Examiner—James C Kerveros
(74) Attorney, Agent, or Firm—Osha Liang LLP

(57) ABSTRACT

A writing control circuit for writing command data supplied from a plurality of host computers onto any of a plurality of register sections, the writing control circuit includes a plurality of request signal storing sections, a host selecting section, and a writing section. The plurality of request signal storing sections correspond to the plurality of host computers and store writing request signals supplied from the corresponding host computers. The host selecting section sequentially selects the request signal storing sections, and receives and outputs data being stored by the selected request signal storing sections. The writing section receives the stored data output by the host selecting section, the command data, and register section specifying data.

9 Claims, 13 Drawing Sheets

TEST APPARATUS AND WRITING CONTROL CIRCUIT

The present application claims priority from a Japanese patent application No. 2003-322093 filed on Sep. 12, 2003, the contents of which are incorporated herein by reference.

FIELD OF THE INVENTION

The present invention relates to a test apparatus for testing electronic devices and a writing control circuit used for the test apparatus.

BACKGROUND ART

In a test apparatus for testing electronic devices such as a semiconductor circuit or a like, conventionally, testing is done by applying a specified pattern signal to electronic device to be tested. The test apparatus includes: a test module to input a predetermined test pattern, testing rate, or a like to electronic device to be tested; and a timing control module to control timing at which the test module inputs a test pattern or the like to the electronic device to be tested.

A plurality of test modules are included in the test apparatus depending on the number of pins of the electronic device to be tested and a plurality of timing control modules are also provided which includes a module to provide timing at which testing is started, a module to provide timing at which a test pattern is to be input, or a like. Conventionally, the timing control module has a variety of configurations depending on its function to be performed.

Since no patent document with relation to the present invention has not been identified at present, the description about the related documents will be omitted.

DISCLOSURE OF THE INVENTION

Problem to be Solved by the Invention

As described above, since the timing control module is configured so as to correspond to each function and it is conventionally, it is necessary to manufacture the timing control modules of various types, thus causing an increase in manufacturing costs. As a result, each of the timing control modules lacks versatility which decreases efficiency in testing electronic devices. To solve such the problem, it is expected that each of the modules has a configuration that enables all functions to be realized in a manner in which an operation to perform each function can be switched. This allows electronic devices to be tested by using only the same module.

However, various functions to be performed by a test apparatus are needed in order to test electronic devices and many pins of a module are required to realize each of the functions and, if all the functions are to be performed by using only one module, the required number of pins of the module becomes enormous, which is impractical. To solve this problem, there is an idea that all functions are realized by using the plurality of test modules each having the same configuration. However, to do this, a problem occurs that all the modules have to be synchronized for operations.

Another problem is that, since each of test modules fabricated by different manufacturers has, in some cases, a different characteristic of time required between inputting and outputting of a signal or a like, simultaneous use of these test modules is difficult. Moreover, there are some cases in which the timing control module receives fail data or the like from a plurality of test modules and distributes a plurality of pieces of data obtained by logically computing the plurality of pieces of data and by compiling resulting data among a plurality of test modules. In such the case, each of the compiling processes and each of distributing processes have to be performed in synchronization with one another. Thus, when the test apparatus does testing of electronic devices by using a plurality of signal sources 30 and a plurality of test modules 14, it is necessary that these supplying sections 30 and test modules 14 receive and transmit signals in synchronization with one another.

In addition, in order to perform each of the compiling and distributing processes from a plurality of host computers, many registers are needed, as a result, also causing an increase in a circuit scale and in manufacturing costs. Therefore, the number of the registers has to be reduced. Furthermore, to perform such the compiling and distributing processes, many signal lines are required, however, when many signal lines are formed on a semiconductor substrate, consideration has to be given to arrangements of circuits on the substrate.

Means to Solve the Problem

To solve the foregoing problems, according to a first aspect of the present invention, there is provided a writing control circuit for writing a plurality of pieces of command data supplied from a plurality of host computers onto a plurality of register sections including: a plurality of request signal storing sections provided in a manner to correspond to the plurality of host computers and to store writing request signals from the plurality of host computers; a host selecting section to sequentially select the plurality of request signal storing sections and to receive and output store data being stored on the selected request signal storing sections; and a writing section to receive the stored data output from the host selecting section, command data to be written onto the plurality of register sections and register section specifying data used to specify the plurality of register sections onto which the command data is to be written, and to write command data onto the plurality of register sections specified by the register section specifying data when the stored data having been received is the writing request signal.

The host selecting section may receive the command data to be written in a manner to correspond to the writing request signal and register section specifying data to specify the register sections onto which the command data is to be written and supplies the command data received from the plurality of host computers corresponding to the plurality of request signal storing sections and the register section specifying data to the writing section.

The writing control circuit may further include: a resetting section to reset the writing request signal being stored on the plurality of request signal storing sections selected by the host selecting section when the stored data having been received from the host selecting section is the writing request signal.

The writing control circuit may further include: a counter section to sequentially generate a plurality of host specifying signals indicating the plurality of request signal storing sections and to supply the generated signals to the host selecting section, wherein the host specifying section sequentially selects the plurality of request signal storing sections to be specified by the host specifying signals being received in order.

The resetting section may receive the plurality of pieces of stored data being stored on the plurality of request signal storing sections and the host specifying signals generated by the counter section and to reset the writing request signals being stored on the request signal storing sections and being specified by the host specifying signals when the stored data being stored on the plurality of request signal storing sections are the writing request signals.

The counter section may sequentially generate binary numbers from zero up to a number being twice as large as the number of the plurality of request signal storing sections and supplies data obtained by removing the least significant signal from the generated binary numbers, as the host specifying signal, to the host specifying section and the resetting section. The writing control circuit may further include an AND circuit which supplies the stored data output from the host selecting section to the writing section when the least significant signal generated by the counter section is logically high. The resetting section may reset the writing request signal being stored on the plurality of request signal storing section to be specified by the host specifying signal when the stored data having been received by the host selecting section is the writing request signal and the least significant signal of the host specifying signal is logically high.

According to a second aspect of the present invention, there is provided a test apparatus for testing electronic devices including: a reference clock generating section to generate a reference clock; a plurality of test modules to apply test pattern signals to be used for testing the electronic devices to the electronic devices according to predetermined clocks; a plurality of distributing circuits to generate timing signals each having a different phase according to the reference clock and to distribute the generated timing signals to one of or among the plurality the test modules; a plurality of register sections provided in a manner to correspond to the plurality of distributing circuits and to store command data indicating one of or the plurality of test modules among which the corresponding distributing circuits are to distribute the timing signals; and a writing control circuit to write each of the plurality of pieces of command data supplied from a plurality of host computers onto any of the plurality of register sections, wherein the writing control circuit includes: a plurality of request signal storing sections provided in a manner to correspond to the plurality of host computers and to store writing request signals supplied from the corresponding host computers; a host selecting section to sequentially select the plurality of request signal storing sections and to receive and output data being stored on the selected request signal storing sections; and a writing section to receive the stored data output by the host selecting section, command data to be written onto the plurality of register sections, and register section specifying data to specify the register sections onto which the command data is to be written and to write the command data onto the register sections to be specified by the register section specifying data when the stored data having been received is the writing request signal.

The host selecting section may receive the command data to be written according to the writing request signal from each of the plurality of host computers and to supply the command data having been received from the plurality of host computers corresponding to the selected request signal storing section to the writing section.

The writing control circuit may further includes a resetting section to reset the writing request signal being stored on the request signal storing section selected by the host selecting section when the stored data received by the host selecting section is the writing request signal.

The summary of the invention does not necessarily describe all essential features so that the invention may also be a sub-combination of these described features.

EFFECT OF THE INVENTION

According to the present invention, since there is no need of having a register for every plural host computers, the number of registers in the test apparatus can be reduced. Moreover, data can be efficiently written on the register.

BRIEF DESCRIPTION OF THE DRAWINGS

FIGS. 7A–7B are diagrams showing a relation between a timing signal and a reference clock, in which FIG. 7A shows one example of cases where an amount of delay created by the reference clock variable delay circuit 36 is not adjusted, and FIG. 7B shows one example of cases where an amount of delay created by the reference clock delay circuit 36 is adjusted.

FIGS. 11A–11C show examples of arrangements on a semiconductor substrate (not shown) in the plurality of compiling sections 160 and of the distributing sections 140, in which FIGS. 11A–11C are drawings showing examples of arrangements of each of the compiling sections 160 and each of the distributing sections 140.

DENOTATION OF REFERENCE NUMERALS

10 . . . reference clock generating section, 12 . . . controlling section, 14 . . . test module, 16 . . . device contacting section, 20 . . . switch matrix, 30 . . . signal source, 32 . . . counter section, 34 . . . feedback system variable delay circuit, 36 . . . reference clock variable delay circuit, 38 . . . flip-flop, 40 . . . feedback system circuit, 42 . . . plurality of flip-flops, 44 . . . feedback signal selecting section, 46 . . . compiling circuit, 48 . . . generating circuit, 50 . . . phase adjusting circuit, 52 . . . plurality of flip-flops, 54 . . . clock selecting section, 56 . . . timing signal distributing circuit, 60 . . . timing supplying section, 62 . . . plurality of flip-flops, 64 . . . timing signal selecting section, 66 . . . synchronizing circuit, 70 . . . clock controlling circuit, 72 . . . flip-flop, 74 . . . selecting section, 76 . . . counter, 78 . . . logic circuit, 80 . . . reference clock distributing circuit, 82 . . . distributor, 84 . . . AND circuit, 86 . . . OR circuit, 88 . . . distributor, 90 . . . outputting section, 100 . . . test apparatus, 110 . . . loop circuit, 112 . . . reference clock selecting section, 114 . . . reference clock selecting section, 116 . . . R circuit, 117 . . . AND circuit, 118 . . . distributor, 119 . . . flip-flop, 120 . . . bus, 122 . . . flip-flop, 124 . . . distributing circuit, 126 . . . flip-flop, 130 . . . computing circuit, 132 . . . flip-flop, 134 . . . OR circuit, 136 . . . flip-flop, 140 . . . distributing section, 142 . . . flip-flop, 144 . . . distributor, 146 . . . register section, 148 . . . AND circuit, 150 . . . OR circuit, 152 . . . flip-flop, 160 . . . compiling section, 162 . . . register section, 164 . . . AND circuit, 166 . . . OR circuit, 168 . . . shift register section, 172 . . . flip-flop, 174 . . . flip-flop, 178 . . . flip-flop, 180 . . . flip-flop, 186 . . . flip-flop section, 188 . . . selecting section, 190 . . . AND circuit, 200 . . . electronic device, 202 . . . selector, 204 . . . writing section, 206 . . . flip-flop, 208 flip-flop, 210 . . . AND circuit, 212 . . . request signal storing section, 214 . . . host selecting section, 216 . . . AND circuit, 218 . . . flip-flop, 220 . . . flip-flop, 222 . . . counter, 224 . . . selector, 226 . . . AND circuit, 230 . . . first distributing point, 232 . . . second distributing point, 234 . . . reference clock passing path, 236 . . . phase adjusting variable delay circuit, 250 . . . OR circuit, 258 . . . main/sub selecting section.

DETAILED DESCRIPTION OF THE INVENTION

The invention will now be described based on preferred embodiments, which do not intend to limit the scope of the present invention, but rather to exemplify the invention. All of the features and the combinations thereof described in the embodiments are not necessarily essential to the invention.

Figure 1:
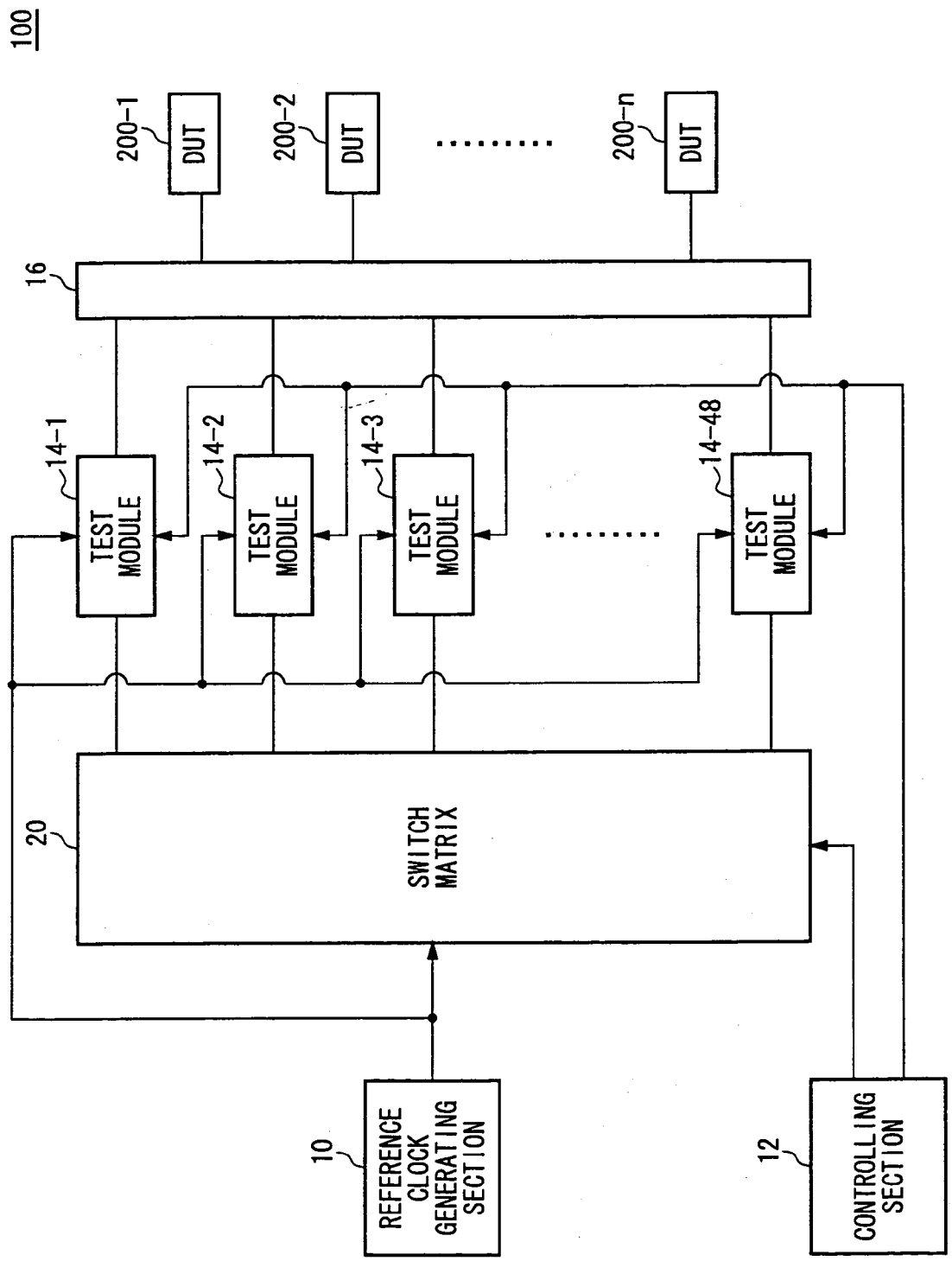
FIG. 1 shows an example of configurations of the test apparatus 100 according to an embodiment of the present invention.

FIG. 1 shows an example of configurations of the test apparatus 100 according to an embodiment of the present invention. The test apparatus 100 tests a plurality of electronic devices (200-1 to 200-n, hereinafter collectively referred to as electronic devices 200). The test apparatus 100 includes a reference clock generating section 10, a controlling section 12, a plurality of test modules (14-1 to 14-48, hereinafter collectively referred to as test modules 14), a device contacting section 16, and a switch matrix 20.

The device contacting section 16 is a test head having, for example, a plurality of electronic devices 200 and electrically connects a plurality of test modules 14 to a plurality of electronic devices 200. Each of the test modules 14 is electrically connected to one of or a plurality of electronic device(s) 200. Also, each of the electronic devices 200 is electrically connected to one of or a plurality of test module(s) 14. For example, each of the test modules 14 and electronic devices 200 has a predetermined number of input and output pins and each of the test modules 14 is connected to each of electronic devices 200 depending on the number of pins of each of the electronic devices 200 and each of the test modules 14.

Moreover, each of the test modules 14 may be a module that supplies a predetermined test pattern to corresponding one of the electronic devices 200. In this embodiment, each of the test modules 14 is provided with a test pattern from the controlling section 12 in advance, and supplies the test pattern signal to the electronic devices 200 with timing at which a timing signal is supplied from the switch matrix 20. Each of the test modules 14 may judge whether or not each of the electronic devices 200 is acceptable according to a signal output from each of the electronic devices 200. In this case, each of the test modules 14 may have fail memory that stores fail data on the electronic devices 200 or the fail data may be supplied to the controlling section 12.

Moreover, when fail data have returned from the electronic devices 200 to either of the plurality of test modules 14, the test module 14 may supply the fail data to the switch matrix 20 in order to distribute the fail data to the other plural test modules 14. In this case, the switch matrix 20 distributes the fail data to one or more desired test module(s) 14.

The reference clock generating section 10 generates a reference clock having a predetermined frequency. Each component of the test apparatus 100 operates according to the reference clock. The switch matrix 20 generates a plurality of timing signals each having a different phase according to a reference clock and supplies a timing signal to corresponding one of the test modules 14. That is, the switch matrix 20 controls timing at which each of the test modules 14 operates by supplying a timing signal to each of the test modules 14.

The controlling section 12 exercises control as to which timing signal with what phase is to be supplied from the switch matrix 20 to each of the test modules 14. Moreover, the controlling section 12 applies, in advance, a test pattern signal to each of the test modules 14. Alternatively, the controlling section 12 may be a host computer such as a workstation or a like. Furthermore, the controlling section 12 may have a plurality of host computers. In this case, electronic devices 200 to be tested are allotted to each of the plurality of host computers and each host computer controls a phase of a timing signal to be supplied to the test modules 14 connected to the allotted electronic devices 200 and to corresponding one of the test modules 14.

Figure 2:
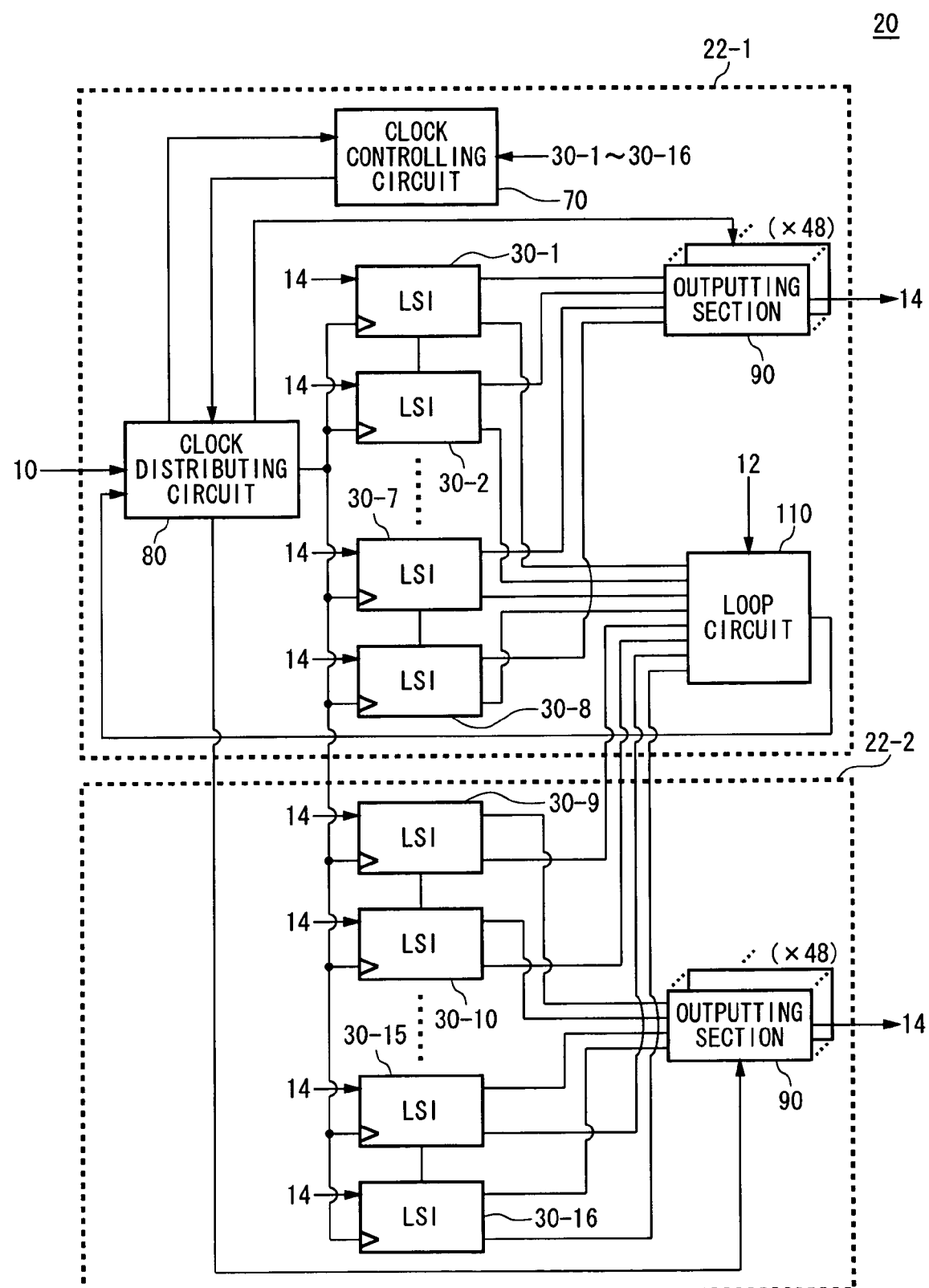
FIG. 2 shows an example of configurations of the switch matrix 20 according to the embodiment of the present invention.

FIG. 2 shows an example of configurations of the switch matrix 20. The switch matrix 20 has a plurality of test boards (22-1 and 22-2, hereinafter collectively referred to as test boards 22). Each of the test boards 22 includes a reference clock distributing circuit 80, a clock controlling circuit 70, a plurality of signal sources (30-1 to 30-16, hereinafter collectively referred to as signal sources 30), a plurality of outputting sections 90, and a loop circuit 110. Configurations and operations of the loop circuit 110 and the clock controlling circuit 70 will be described later with reference to FIG. 3.

The reference clock distributing circuit 80 receives a reference clock generated by the reference clock generating section 10 and distributes the received reference clock among components in the switch matrix 20. Each of the signal sources 30 outputs an output signal to test electronic devices 200 to be tested according to the reference clock to be input as an input signal. For example, each of the signal sources 30 supplies a timing signal indicating timing at which a test pattern signal is applied to electronic devices 200, a timing signal indicating timing at which testing of the electronic devices 200 is started, a timing signal indicating timing at which the testing of the electronic devices 200 is stopped, a timing signal indicating timing at which fail data on electronic devices 200 is captured, or the like to the test modules 14 via each of the outputting sections 90.

In the embodiment, each of the signal sources 30 generates a plurality of timing signals, each having a different phase, as the output signal described above according to a reference clock to be input. Then, the controlling section 12 makes each of the signal sources 30 determine which timing signal, out of the plurality of timing signals generated by the signal sources 30, is to be supplied to each of the test modules 14. This enables control, for example, on timing at which each of the test modules 14 applies a test pattern signal to electronic devices 200. Moreover, each of the signal sources 30 outputs a reference clock used for generation of the timing signal in synchronization with a timing signal.

Functions of the plurality of signal sources 30 are respectively predetermined; that is, a function for controlling timing at which a test pattern signal is applied to electronic devices 200, a function for controlling timing at which testing of electronic devices 200 is started, a function for controlling timing at which testing of electronic devices 200 is stopped, a function for controlling timing at which fail data on electronic devices 200 is captured, and the like. Moreover, each of the signal sources 30 is an integrated circuit having the same configuration and having a circuit structure that enables all the functions described above to be performed by switching an operation mode. The operation mode is controlled by a signal level supplied to the test board 22. Thus, by constructing each of the signal sources 30 so as to have the same circuit configuration, versatility of the signal sources 30 can be improved.

Furthermore, when one of the signal sources 30 is to have the circuit configuration so as to perform all the functions described above, it may lack pins to be used for inputting or outputting of signals in some cases. In such the cases, the problem of lacking in the pins for inputting or outputting of signals can be solved by combining a plurality of signal sources 30. For example, the test apparatus 100, as shown in FIG. 2, is operated by combining the signal source 30-1 with the signal source 30-2. In the embodiment, the controlling section 12 allots any of the functions described above to each of the signal sources 30 operating in combination.

A plurality of outputting sections 90 is provided in a manner to correspond to a plurality of test modules 14 and receives timing signals from any one of the plurality of signal sources 30 and supplies the received timing signals to corresponding one of the test modules 14. A supply of the timing signal from which one of the signal sources 30 to each of the outputting sections 90 is controlled by the controlling section 12 according to a function of each of the test modules 14 and each of the signal sources 30.

As for the test apparatus 100, since it does testing of electronic devices 200 by using a plurality of signal sources 30, it is preferable that the plurality of test modules 14 receives and transmits signals in synchronization among the pluralities of signal sources 30 and of the test modules 14. The test apparatus 100 of the embodiment makes following adjustments:

(1) adjustments of timing at which the plurality of signal sources 30 outputs a timing signal;

(2) adjustments of a phase of a timing signal according to a characteristic of each of the test modules 14; and (3) adjustments of a phase of a reference clock to be applied to each of the signal sources 30 when the plurality of signal sources 30 is used in combination with one another.

First, the adjustments of timing at which a plurality of signal sources 30 outputs timing signals will be described by referring to FIG. 3 to FIG. 6.

Figure 3:
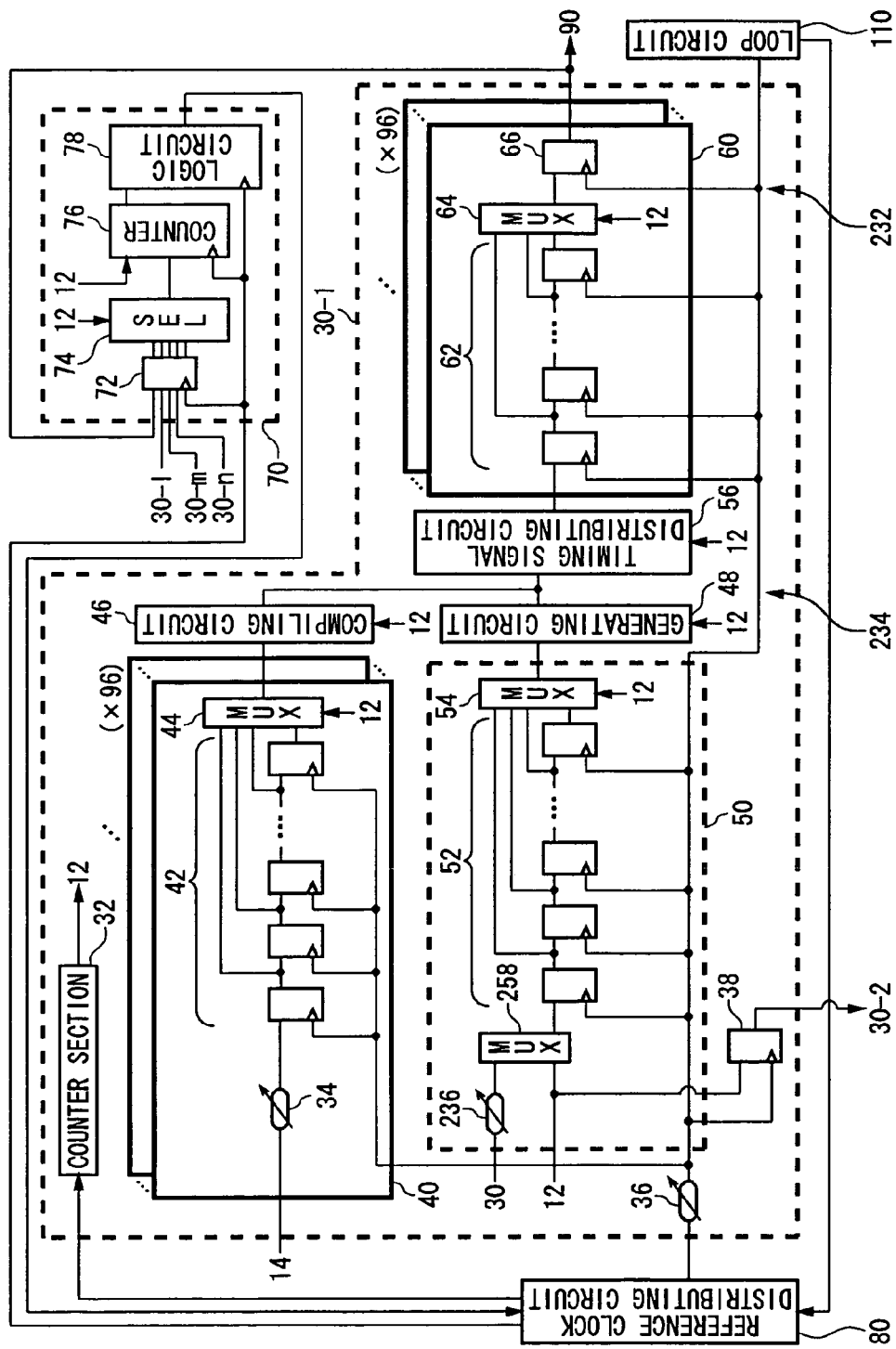
FIG. 3 shows an example of configurations of the signal source 30 and the clock controlling circuit 70 according to the embodiment of the present invention.

FIG. 3 shows an example of configurations of the signal source 30 and the clock controlling circuit 70 according to the embodiment of the present invention.

Each of the signal sources 30 includes a timing signal distributing circuit 56, a compiling circuit 46, a generating circuit 48, a plurality of feedback system circuits 40, a plurality of timing supplying sections 60, a phase adjusting circuit 50, a reference clock variable delay circuit 36, a flip-flop 38, a counter section 32, and a reference clock passing path 234. Moreover, the clock controlling circuit 70 includes a flip-flop 72, a selecting section 74, a counter 76, and a logic circuit 78.

The reference clock passing path 234 receives a reference clock through the reference clock distributing circuit 80 from the reference clock generating section 10 and outputs the received reference clock to the loop circuit 110. The reference clock passing path 234 has a plurality of distribution points used to distribute the received reference clock among blocks of the signal sources 30 and the flip-flops provided in each of the signal sources 30 or the like operate according to the reference clock.

The reference clock variable delay circuit 36 is provided in the reference clock passing path 234 and delays a reference clock. It is preferable that the reference clock variable delay circuit 36 is provided upstream from the plurality of distribution points in the reference clock passing path 234. The reference clock having passed through the reference clock passing path 234 is input to the loop circuit 110.

The loop circuit 110 makes a reference clock output from each of the signal sources 30 loop, and inputs the reference clock as an input signal to each of the signal sources that has output the reference clock through the reference clock distributing circuit 80. It is preferable that the loop circuit 110 makes a reference clock selected loop in turn through substantially the same path and inputs the reference clock to the signal sources 30. The test apparatus 100 detects variations in timing at which each of the signal sources 30 outputs a timing signal by measuring a period of looping of a reference clock. By the adjustment of timing at which each of the signal sources 30 outputs a timing signal, even if timing signals are supplied from the plurality of signal sources 30 to the plurality of test modules 14, the plurality of test modules 14 can be operated in synchronization with one another.

Figure 4:
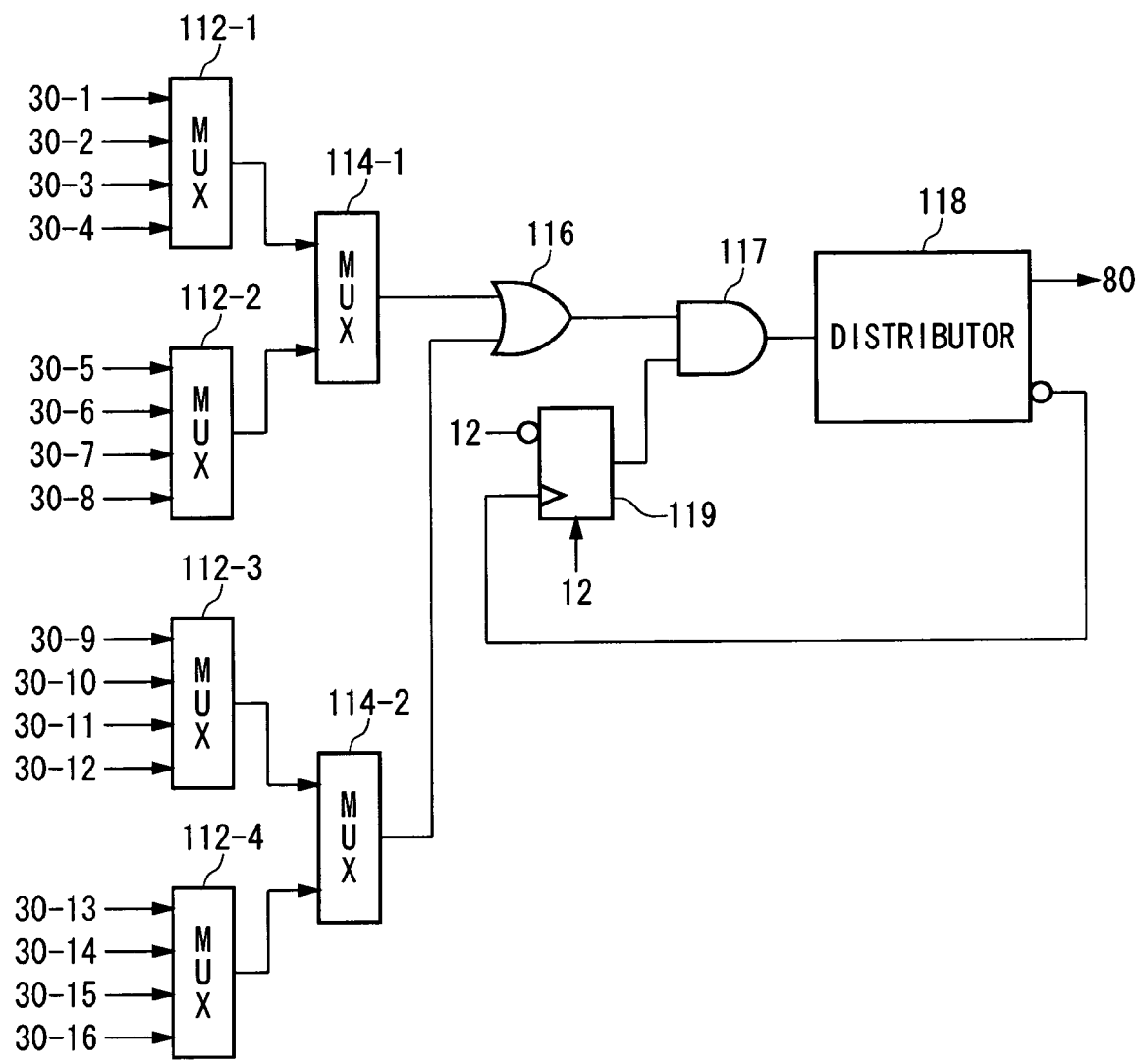
FIG. 4 shows an example of configurations of the loop circuit 110 according to the embodiment of the present invention.

FIG. 4 shows an example of configurations of the loop circuit 110. The loop circuit 110 includes a plurality of reference clock selecting sections (112-1 to 112-4, 114-1 to 114-2), an OR circuit 116, an AND circuit 117, a flip-flop 119, and a distributor 118. The loop circuit 110 receives a reference clock output from a plurality of signal sources 30 and selects the received reference clocks in turn and makes the selected reference clock loop.

In the embodiment, the plurality of reference clock selecting sections (112-1 to 112-4, 114-1 to 114-2) and the OR circuit 116 sequentially select one of the plurality of reference clocks. The AND circuit 117 outputs a logical product of the selected reference clock and the signal output from the flip-flop 119 to the distributor 118. The flip-flop 119 exercises control as to whether the reference clock is made to loop. The flip-flop 119 is provided with a signal to decide whether a reference clock is made to loop by the controlling section 12 and outputs the signal, according to a reversed signal of the reference clock supplied from the distributor 118. The distributor 118 makes a reference clock output from the AND circuit 117 loop through the reference clock distributing circuit 80. The loop circuit 110 makes each reference clock selected loop in turn via the same path through the reference clock distributing circuit 80. This reduces an error in measuring a looping period in each of the signal sources 30.

Figure 5:
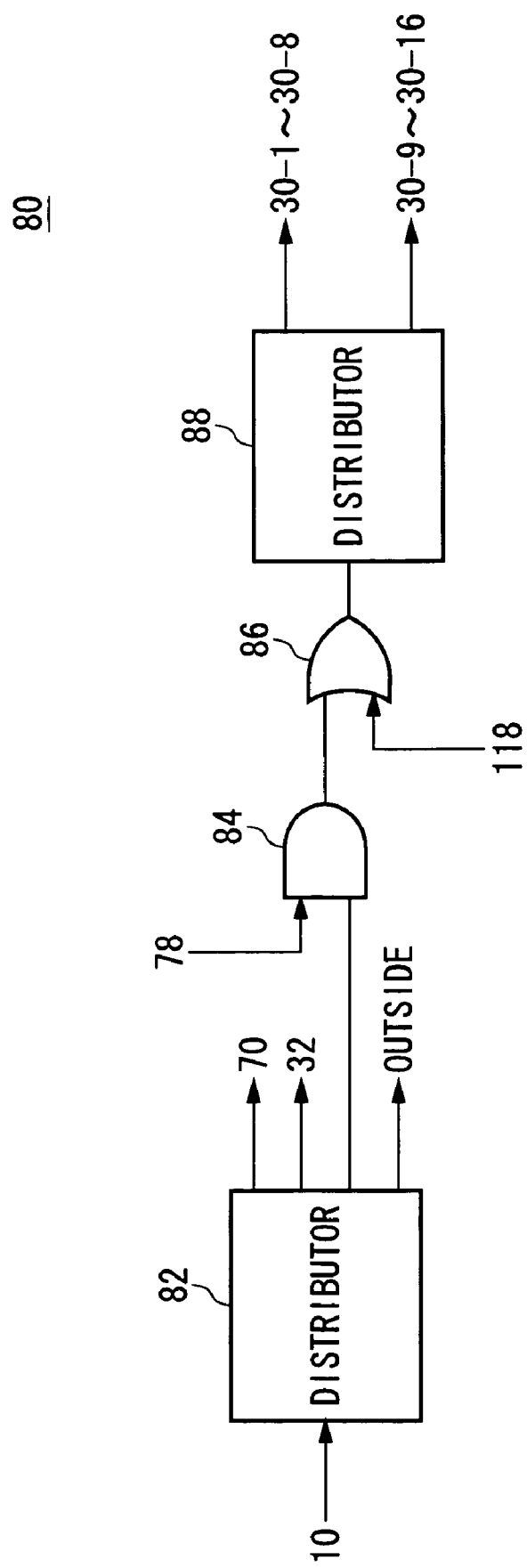
FIG. 5 shows an example of configurations of the reference clock distributing circuit 80 according to the embodiment of the present invention.

FIG. 5 shows an example of configurations of the reference clock distributing circuit 80 according to the embodiment of the present invention. The reference clock distributing circuit 80 includes a distributor 82, an AND circuit 84, an OR circuit 86, and a distributor 88. The distributor 82 receives a reference clock from the reference clock generating section 10 and distributes a reference clock among components that are to operate according to the reference clock. The AND circuit 84 receives a reference clock from the distributor 82 and outputs a logical product of a signal supplied from the clock controlling circuit 70 described later and the reference clock.

That is, the AND circuit 84 selects whether the passage of the reference clock is allowed or not based on the signal supplied from the clock control circuit 70.

The OR circuit 86 outputs a logical sum of a reference clock supplied from the AND circuit 84 and a reference clock made to loop by the loop circuit 110. When the period of the looping is measured, the clock controlling circuit 70 inputs a logical L to the AND circuit 84 and exercises control so as not to permit the reference clock supplied from the reference clock generating section 10 to pass. When the period of the looping is not measured, the clock controlling circuit 70 inputs a logical H to the AND circuit 84. The distributor 88 supplies a reference clock output from the OR circuit to the plurality of signal sources 30. When the period of the looping is measured, the distributor 88 supplies the received reference clock to the signal source 30 which is measuring the period of the looping.

It is also preferable that the loop circuit 110 makes a reference clock supplied from one of the signal sources 30 loop successively. That is, each reference clock is preferably made to loop plural times within a predetermined period of time. The counter section 32 (see FIG. 3) counts how many times a reference clock loops within a predetermined period of time and, based on a result from the counting, the loop circuit 110 sequentially measures a period of the looping in the signal sources 30 corresponding to the reference clock made to loop in turn.

For example, the counter section 32 receives a reference clock from the distributor 82, while counting pulses of the reference clock predetermined number of times, counts how many times the loop circuit 110 has made the reference clock loop. At this time point, the reference clock made to loop by the loop circuit 110 is input to the counter section 32.

Based on the counting results, the counter section 32 then measures a period between inputting of an input signal (reference clock) and inputting of a loop signal (reference clock) in each of the signal sources 30. By making a reference clock loop several times, the period of the looping in each of the signal sources 30 can be measured more accurately. For example, it is preferable that the loop circuit 110 makes the reference clock loop about 4000 times.

Based on the period in each of the signal sources 30 measured by the counter section 32, the controlling section 12 controls delay to be created by the reference clock variable delay circuit 36 provided in each of the signal sources 30 and makes the period in each of the signal sources 30 be substantially the same. By controlling as above, a deviation in outputting timing of a timing signal caused by variations among the plurality of signal sources 30 can be reduced.

Moreover, the generation circuit 48 of the signal source 30 receives a timing signal output from the phase adjusting circuit 50, and generates a plurality of timing signals, each having a different phase, based on the received timing signal. In this embodiment, the generating circuit 48 generates a plurality of timing signals each having a different phase at phase solution being equal to that of a period of a reference clock.

The timing signal distributing circuit 56 selects any one of a plurality of timing signals generated by the generating circuit 48 for each of the timing supplying sections 60 and supplies the signal to each of the timing supplying sections 60. The plurality of timing supplying sections 60 is provided in a manner to correspond to one outputting section 90 for every two timing supplying sections 60 and supplies a timing signal to the corresponding outputting section 90. Each of the timing supplying sections 60 has a synchronizing circuit 66 to which a reference clock is distributed from a second distributing point 232 connected at the most downstream in the reference clock passing path 234 and which outputs, in synchronization with the distributed reference clock, a timing signal selected by the timing signal distributing circuit 56 to the test modules 14.

The loop circuit 110 receives a reference clock having passed through the second distributing point 232 and makes the received reference clock loop. By control on an amount of delay to be created by the reference clock variable delay circuit 36 exercised by the controlling section 12, timing at which a reference clock is distributed into the synchronizing circuit 66 in each of the plurality of signal sources 30 is made substantially the same. As a result, the plurality of signal sources 30 can output a timing signal with substantially the same timing.

Moreover, it is preferable that, in the reference clock passing path 234, the second distributing point 232 is placed the most downstream from the plurality of distributing points. Each of the signal sources 30 formed on a semiconductor substrate preferably outputs a reference clock from a vicinity of the second distributing point 232 to the loop circuit 110. By measuring a period of the looping of a reference clock with a path from the second distributing point 232 to an outputting point of a reference clock being shortened, a deviation in a phase between the reference clock received by the loop circuit 110 and the timing signal output by each of the signal sources 30 can be reduced. As a result, a deviation in timing at which each of the signal sources 30 outputs a timing signal can be more reduced.

Moreover, the test apparatus 100 can apply a test pattern signal to one of electronic devices 200 from a plurality of test modules 14 and the controlling section 12 may control an amount of delay to be created by each of the reference clock variable delay circuits 36 so that a period in each of the signal sources 30 which supplies a timing signal to a plurality of test modules 14 to apply a test pattern signal to one of electronic devices 200 is made substantially the same.

Figure 6:
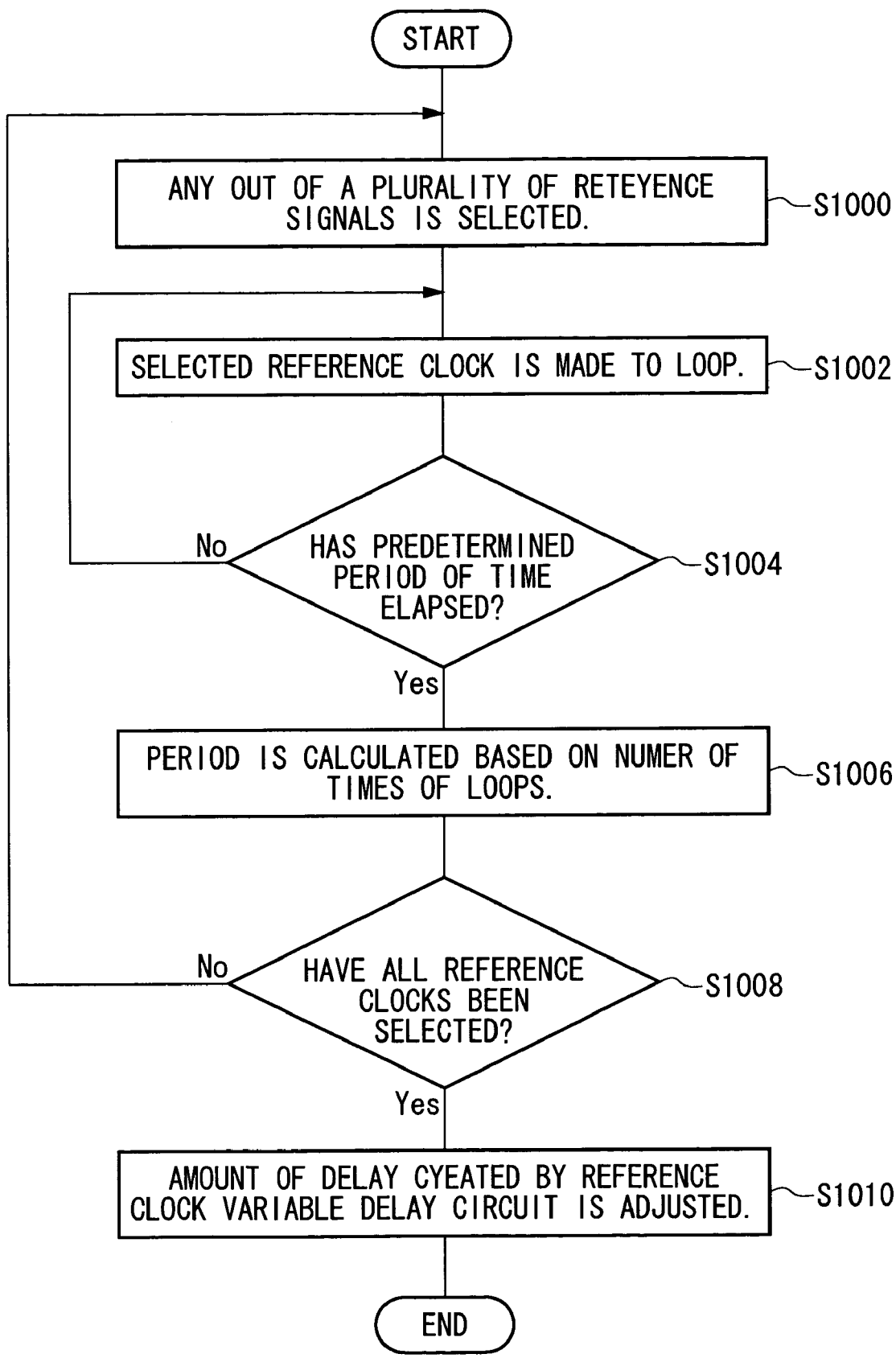
FIG. 6 is a flowchart showing one example of methods for adjusting timing at which a plurality of signal sources 30 outputs a timing signal described with reference to FIG. 3 to FIG. 5.

FIG. 6 is a flowchart showing one example of methods for adjusting timing at which a plurality of signal sources 30 outputs a timing signal described with reference to FIG. 3 to FIG. 5. First, in S1000, the loop circuit 110 selects any one of a plurality of reference clocks output by a plurality of signal sources 30. Next, in S1002, the reference clock selected by the loop circuit 110 is made to loop and the looped signal is input to the signal sources 30 that has output the reference clock.

Then, in S1004, the counter section 32 judges whether or not a predetermined period of time has elapsed and, if the predetermined period of time has not elapsed yet, the looping of the reference clock is continued. When the predetermined period of time has elapsed, in S1006, a period of the looping in corresponding one of the signal sources 30 is calculated based on the number of times of the looping of a reference clock. Next, in S1008, whether or not all reference clocks to be output from the plurality of signal sources 30 have been selected and, if all the reference clocks have not been selected, a subsequent reference clock is selected (in S1000) and processing in S1002 to S1006 is repeated.

In a case where all the reference clocks are selected and a period in all signal sources 30 is calculated, in S1010, an amount of delay created by the reference clock variable delay circuit 36 in each of the signal sources 30 is adjusted to make timing at which each of the signal sources 30 outputs a timing signal be substantially the same and the adjustment is now terminated.

Next, adjustments of a phase of a timing signal according to a characteristic of each of the test modules 14 are described with reference to FIG. 3 and FIG. 7. As described above, a plurality of timing supplying sections 60 in the signal sources 30 is provided in a manner to correspond to a plurality of test modules 14. However, in each of the test modules 14, a period of time between receipt of a timing signal and outputting of a test pattern is not always the same. For example, variations occur in the period of time depending on the characteristic of each of the test modules 14. Therefore there are some cases where, a test pattern signal or a like is not simultaneously input into electronic devices 200 even if timing signals are simultaneously input into a plurality of test modules 14. In order to compensate for the variations, the test apparatus 100 of the embodiment adjusts a phase of a timing signal to be output by each of the signal sources 30.

As shown in FIG. 3, each of the timing supplying sections 60 has a plurality of flip-flops 62 being cascaded, a timing signal selecting section 64, and the synchronizing circuit 66. Moreover, each of the timing supplying sections 60 is provided in a manner to correspond to a plurality of test modules 14 and receives a timing signal from the timing signal distributing circuit 56 and supplies a timing signal to the corresponding test modules 14.

The generating circuit 48 generates timing signals each having only one falling edge or only one rising edge for a predetermined period of time and supplies the timing signals to the timing signal distributing circuit 56. It is preferable that the predetermined period of time is longer than a period of the reference clock. The plurality of flip-flops 62 receives the timing signals from the timing distributing circuit 56 and passes the timing signals sequentially to the next-stage flip-flops 62 according to a reference clock distributed from the reference clock passing path 234. That is, each of the plurality of flip-flops 62 passes a value of each of the timing signals to a next-stage one of the flip-flops 62 according to the reference clock.

The timing signal selecting section 64 adjusts a phase of the timing signal to be supplied to each of the test modules 14 by receiving timing signals output from each of the plurality of flip-flops 62, by selecting anyone of the plurality of timing signals received and by supplying the timing signal to each of the test modules 14.

The controlling circuit 12 adjusts a phase of each of the timing signals to be supplied by the plurality of timing supplying circuits 60 to each of the test modules 14. In the embodiment, the controlling section 12 exercises control as to which timing signal out of the plurality of timing signals is to be selected by the timing signal selecting section 64 so that the timing at which each of the test modules 14 outputs a test pattern signal according to the timing signal is made substantially the same. It is preferable that the test apparatus 100 is provided with a means for detecting timing at which the test modules 14 output the test pattern signals.

In the embodiment, timing at which the test modules 14 output test patterns is detected by the plurality of feedback system circuits 40. The plurality of feedback system circuits 40 is provided in a manner to correspond to the plurality of test modules 14 as in the case of the plurality of timing supplying sections 60 and the test modules 14 input a signal whose value changes with timing at which the test pattern is output to corresponding one of the feedback system circuits 40. Each of the feedback system circuits 40 has a plurality of flip-flops 42 being cascaded. Each of the plurality of flip-flops 42 passes, in turn, signals input from each of the test modules 14, according to a reference clock, to a next-stage one of the flip-flops 42.

The controlling section 12 reads out a value stored on the plurality of flip-flops 42 and detects timing at which each of the test modules 14 outputs a test pattern signal according to which stage flip-flop changes the value. Moreover, the controlling section 12 may be provided, in advance, with a phase of a timing signal to be supplied to each of the test modules 14 depending on specifications of each of the test modules 14.

Figure 7A:
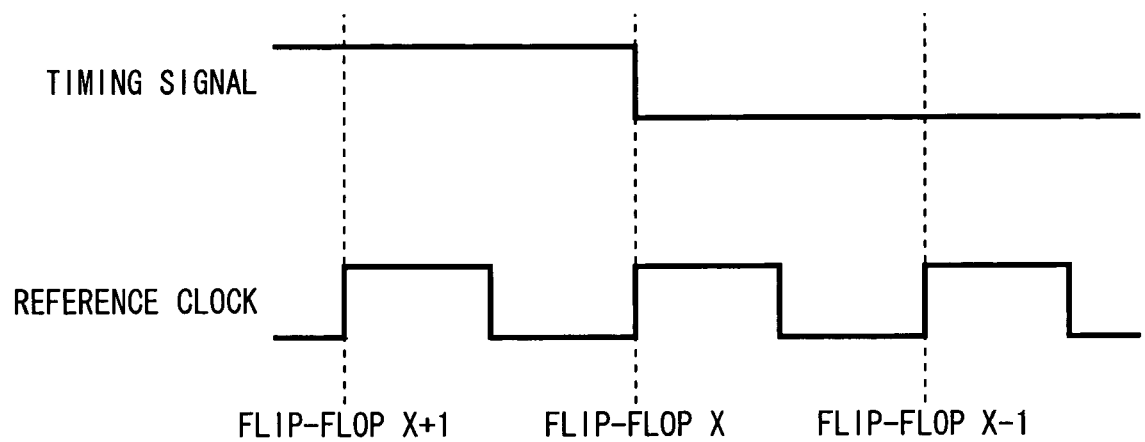
Figure 7B:
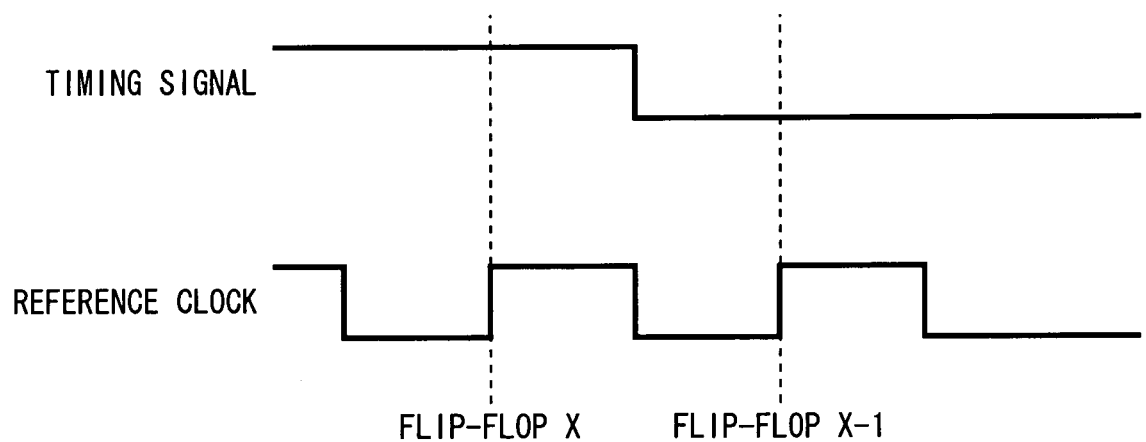

FIGS. 7A–7C are diagrams showing a relation between a timing signal and a reference clock. FIG. 7A shows one example of cases where an amount of delay created by the reference clock variable delay circuit 36 is not adjusted and FIG. 7B shows one example of cases where an amount of delay created by the reference clock delay circuit 36 is adjusted.

In a case where an amount of delay created by the reference clock variable delay circuit 36 is not adjusted, when any one of the flip-flops 62 captures a value of a timing signal according to a reference clock, as shown in FIG. 7A, there occur some cases where the value of the timing signal is captured with timing at which the value of the timing signal changes. In such the case, each of the flip-flops 62 fails to capture a value of the timing signal in a stable manner.

Therefore, the controlling section 12 of the embodiment adjusts an amount of delay created by the reference clock variable delay circuit 36 as described above and shifts the timing at which any one of the flip-flops 62 captures a value of the timing signal from the timing at which a value of the timing signal changes, as shown in FIG. 7B.

Moreover, each of the feedback system circuits 40 receives, from corresponding one of the plurality of test modules 14, a signal such as a fail timing signal indicating a time at which a fail occurred in a pattern output from electronic devices 200 and supplies the fail timing signal to the timing supplying sections 60. At this time point, in some cases, a shift may occur in a phase of a fail timing signal in each of the feedback system circuits 40 due to a characteristic of each of the test modules 14. That is, in some cases, time between generation of fail timing signals by each of the test modules 14 and supply of the generated fail timing signals to the feedback system circuits 40 may differ depending on the test modules 14.

There are some cases where the test apparatus 100 controls operations of the plurality of test modules 14 according to a signal to be supplied from the test modules 14 to the signal sources 30, for example, in such a case where, when a fail is detected in any one of the test modules 14, application of a test pattern signal in the plurality of test modules 14 is stopped. In the case of such the control to be exercised, synchronous control on the plurality of test modules 14 is difficult if time between the generation of, for example, a fail timing signal by each of the test modules 14 and the supply of the fail timing signals to each of the feedback system circuits 40 differs depending on the test modules 14. The controlling section 12 controls a plurality of feedback system circuits 40 so that timing at which each of the feedback system circuits 40 outputs fail timing signals is made substantially the same and compensates for the deviation described above.

In the embodiment, each of the feedback system circuits 40 has a plurality of flip-flops 42 being cascaded, a feedback system variable delay circuit 34, and a feedback signal selecting section 44. Each of the plurality of flip-flops 42 receives fail timing signals and, according to a reference clock to be distributed from the reference clock passing path 234, sequentially passes the fail timing signals to a next-stage one of the flip-flops 42.

The feedback signal selecting section 44 receives a plurality of fail timing signals output from each of the plurality of flip-flops 42 and selects one out of the plurality of fail timing signals received. Then, by supplying the selected fail timing signal to the timing supplying circuit 60 through the compiling circuit 46 and the timing signal distributing circuit 56, timing, at which the fail timing signal is supplied to the timing supplying section 60, is adjusted.

The controlling section 12 controls a phase of a fail timing signal to be supplied by the plurality of feedback system circuits 40 to each of the timing supplying sections 60. In the embodiment, the controlling section 12 exercises control as to which one out of the plurality of fail timing signals is to be selected. In the embodiment, the controlling section 12 reads out a value stored on a plurality of flip-flops 42 and detects which stage flip-flop changes the value. Then, the controlling section 12 also exercises control as to which fail timing signal is to be selected by the feed signal selecting section 44 according to a difference in the number of flip-flops of the detected flip-flops in each of the feedback system circuits 40.

Moreover, the feedback system variable delay circuit 34 is provided between each of the test modules 14 and each of the plurality of flip-flops 42 and delays a fail timing signal and then supplies the delayed fail timing signals to the plurality of flips-flops 42. The controlling section 12 sequentially changes an amount of delay to be created by the feedback system variable delay circuit 34, detects an amount of delay, to be created by the feedback system variable delay circuit 34, which makes timing at which a value of a fail timing signal changes be substantially the same as timing at which any one of the plurality of flip-flops captures the value of the fail timing signal, and sets an amount of delay to be created by the feedback system variable delay circuit 34 at an amount of delay being deviated by a half of a period of a reference clock from the detected amount of the delay.

In addition, when values stored on each of the plurality of flip-flops (42, 52, and 62) are to be detected, it is preferable that supply of a reference clock to be supplied from the reference clock distributing circuit 80 is stopped and operations of the plurality of flip-flops (42, 52, and 62) are stopped. In this embodiment, the clock controlling circuit 70 supplies a signal to stop the supply of a reference clock to the reference clock distributing circuit 80.

The clock controlling circuit 70 includes a flip-flop 72, a selecting section 74, a counter 76, and a logic circuit 78. The flip-flop 72 receives timing signals output from the plurality of signal sources 30 and supplies the timing signals to the selecting section 74. The selecting section 74 selects a timing signal output from the signal sources 30 that adjust timing or a phase, out of the plurality of timing signals received from the flip-flops 72 and supplies the selected timing signal to the counter 76. The counter 76 starts counting of the number of reference clocks when a value of the received timing signal changes, and outputs a signal to make the logic circuit 78 stop the supply of the reference clocks when the number of reference clocks reaches a specified number. The logic circuit 78 supplies a signal received from the counter 76 to the AND circuit 84 in the reference clock distributing circuit 80 and stops the supply of the reference clock to be supplied to the signal sources 30.

The controlling section 12 sets the counter 76 for a specified number and controls timing at which the supply of reference clocks is stopped. The controlling section 12 controls the counter 76 so that, for example, a flip-flop provided in a center position out of the plurality of flip-flops 42 detects a change of a value of a fail timing signal.

Moreover, each of the plurality of feedback system circuits 40 supplies a fail timing signal to each of the test modules 14 through the compiling circuit 46, timing signal distributing circuit 56, and timing supplying section 60. The compiling circuit 46 receives fail timing signals output from the plurality of feedback circuits 40, performs logic operations of plural types according to a plurality of fail timing signals, and supplies a result of each of the logic operations to the timing signal distributing circuit 55. The timing signal distributing circuit 56 supplies each of the results from the computations to any one of or a plurality of timing supplying sections 60. Configurations of the compiling circuit 46 and timing signal distributing circuit 56 will be described later with reference to FIGS. 8 and 9.

Next, adjustments of a phase of a reference clock to be supplied to each of the plurality of signal sources 30 in the case where the plurality of signal sources 30 is combined will be described by referring to FIG. 3 and FIG. 8. When a plurality of signal sources 30 is combined, any one of the combined signal sources 30 functions as a main signal source which generates a first timing signal to be used to control timing at which the test modules 14 apply test pattern signals to electronic devices 200, according to a phase of a given timing signal, and supplies the generated first timing signal to a predetermined one of or a plurality of pins of each of the test modules 14. Moreover, other signal sources 30 receive a timing signal from the main supplying section and generate a second timing signal used to control timing at which the test modules 14 apply test pattern signals to electronic devices according to a phase of the received reference clock and supply the generated second timing signal to one of or a plurality of pins, to which the main signal source does not feed any signal, out of the test modules 14. In the embodiment, cases where a signal source 30-1 functions as the main signal source and a signal source 30-2 functions as the sub signal source will be described.

Each of the signal sources 30 has the phase adjusting circuit 50 to delay a timing signal received from the main signal source in the case where the signal sources 30 function as the sub signal source. In the phase adjusting circuit 50, a timing signal generated by the control unit 12 is provided through the main signal source 30, and a reference clock is distributed from the reference clock passing path 234.

Moreover, when the signal source 30 functions as a main signal source, the phase adjusting circuit 50 supplies a timing signal received from the control unit 12 to the phase adjusting circuit 50 of the sub signal source. Each of the signal sources 30, when serving as the main signal source, has a flip-flop 38 to supply a timing signal to the sub signal source. The flip-flop 38 supplies the received timing signal to the sub signal source.

Moreover, in a case where the signal sources 30 function as the sub signal source, the phase adjusting circuit 50 receives a timing signal from the flip-flop 38 in the main signal source. The phase adjusting circuit 50 adjusts a phase of the received timing signal and supplies the timing signal to the generating circuit 48. The generating circuit 48, timing signal distributing circuit 56, and timing supplying section 60 generate a timing signal according to the received timing signal and supply the signal to the test modules 14. The phase adjusting circuit 50 in the sub signal source makes timing at which the main signal source outputs a first timing signal be substantially the same as timing at which the sub signal source outputs a second timing signal by delaying the timing signal received from the main signal source.

Figure 8:
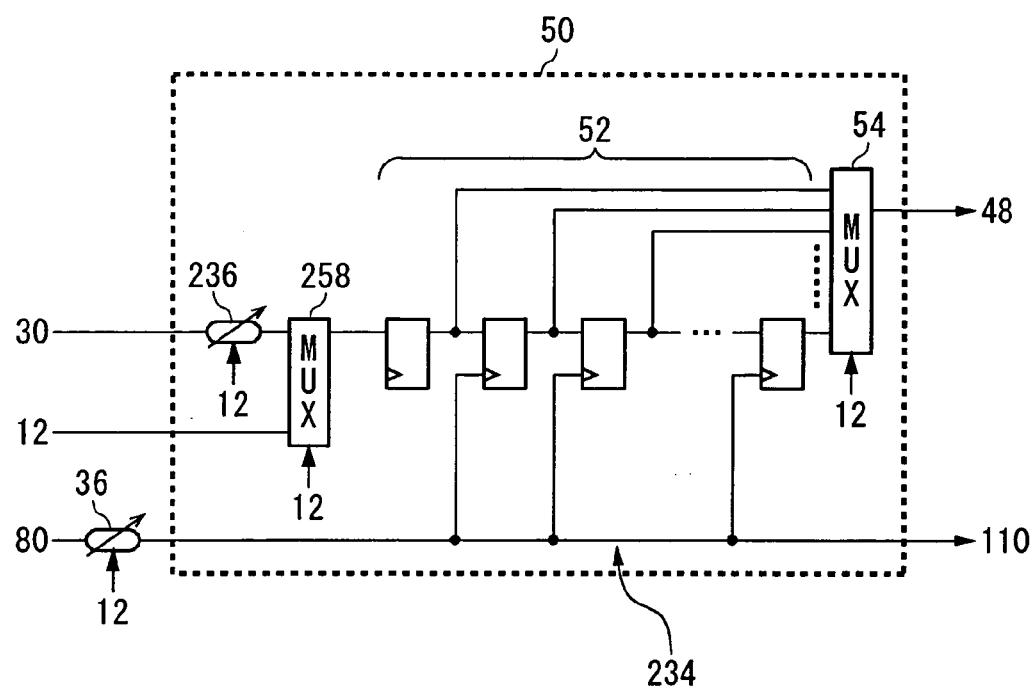
FIG. 8 shows an example of configurations of the phase adjusting circuit 50.

FIG. 8 shows an example of configurations of the phase adjusting circuit 50. The phase adjusting circuit 50 includes a phase adjusting variable delay circuit 236, a plurality of flip-flops 52 being cascaded, a main/sub selecting section 258, and a timing selecting section 54. When the signal source 30 functions as the sub signal source, the phase adjusting variable delay circuit 236 receives the timing signal from the main signal source, delays the timing signal for a predetermined period of time, and supplies it to the main/sub selecting section 258. The main/sub selecting section 258 selects which one out of a timing signal delayed by the phase adjusting variable delay circuit 236, a timing signal received fro, the controlling section 12 is to be supplied to the plurality of flip-flops 52.

The controlling section 12 exercises control as to which timing signal is to be selected by the main/sub section 258 depending on whether the signal source 30 functions as either of the main signal source or the sub signal source. That is, in a case where the signal source 30 functions as the main supplying section, the main/sub selecting section 258 selects a timing signal received from the controlling section 12 and, in a case where the signal source 30 functions as the sub supplying section, the sub supplying section, the main/sub selecting section 258 selects a timing signal delayed by the phase adjusting variable delay circuit 236.

A plurality of flip-flops 52 receives the timing signal selected by the main/sub selecting section 258 and sequentially passes the received timing signal according to the timing signal generated by the timing signal generating section 10 and distributed by the timing signal passing path 234. The clock selecting section 54 receives timing signals output by each of the flip-flops 52 and selects any one of the received plurality of timing signals and outputs the timing signal as a second timing signal through the generating circuit 48, timing signal distributing circuit 56, and timing supplying section 60.

The controlling section 12 exercises control as to which timing signal is to be selected by the clock selecting section 54 and makes timing at which the main signal source outputs a first timing signal be substantially the same as timing at which the sub signal source outputs a second timing signal. For example, the controlling section 12 makes the clock selecting section 54 in the main signal source select a timing signal output by a predetermined one out of the plurality of flip-flops 52 to exercise control as to which timing signal is to be selected by the clock selecting section 54 in the sub signal source is to be selected and makes timing at which the main signal source outputs a first timing signal be substantially the same as timing at which the sub signal source outputs a second timing signal. In this case, it is preferable that the controlling section 12 makes the clock selecting section 54 in the main signal source select a timing signal output by one flip-flop provided in an substantially central position out of the plurality of flip-flops 52 being cascaded.

By such the configuration described above variation, in the phase of the timing signal given to each signal source 30, when combining a plurality of signal sources 30, can be adjusted.

Next, an adjustment method of the phase of the timing signal in the main signal source and the sub signal source will be explained. (1) First, in the main signal source and the sub signal source, the clock control circuit 70 stops the reference clock to be supplied to the main signal source and the sub signal source by the reference clock distributing circuit 80 at a predetermined timing so that the timing signal received from the control unit 12 can be stored on the plurality of flip-flops 52.

(2) At this time, the controlling section 12 supplies the timing signal to the main signal source and obtains that which one out of the plurality of flip-flops 52 of the main signal source was used for detecting the value change of the timing signal, and whether the value-change point of the timing signal received through the phase adjusting variable delay circuit 236. It is preferable that the controlling section 12 includes means for detecting the value of the timing signal stored on each flip-flip of the plurality of flip-flops 52.

Then, the delay amount, at which the timing of changing the timing signal and the timing of taking the value of timing signal by one of the plurality of flip-flops 52 become substantially equal to each other, will be detected by sequentially changing the delay amount of the phase adjusting variable delay circuit 236 of the sub signal source. That is, whenever it changes the delay amount of the phase adjusting variable delay circuit 236, operation of (2) described-above is repeated and the delay amount to be shifted by the value stored on the plurality of flip-flops 52 is detected. Then, the control unit 12 sets the delay amount of the phase adjusting variable delay circuit 236 of the sub signal source to be a delay amount shifted from the detected delay amount by a half period of the reference signal. Such the control can perform timing adjustment of the reference clock less than or equal to one period.

Next, after setting up the delay amount of the phase adjusting variable delay circuit 236, as explained for the operation (2), which one out of the plurality of flip-flops 52 of the main signal source was used for detecting the value change of the timing signal was detected, and which one out of the plurality of flip-flops 52 of the sub signal source was used for detecting the value-change point of the timing signal received through the phase adjusting variable delay circuit 236, will be obtained. Then, when there is a difference of the used flip-flop 52 for the detection of the value-change of the timing signal between the main signal source and the sub signal source, the difference will be absorbed by adjusting each flip-flop selected by each timing selecting section 54. Such the control can perform timing adjustment of the integral multiple of the period of the reference clock.

Thus, as described with reference to FIG. 3 to FIG. 8, according to the test apparatus 100 of the embodiment, it is possible to make adjustments to timing at which a plurality of signal sources 30 outputs a timing signal, to a phase of a timing signal so as to correspond to a characteristic of each of the test modules 14, and to a phase of a reference clock to be supplied to each of the plurality of signal sources 30 configured in combination with one another, thus enabling a plurality of test modules 14 to operate in synchronization with one another and, as a result, accurate testing of electronic devices 20 is made possible.

Figure 9:
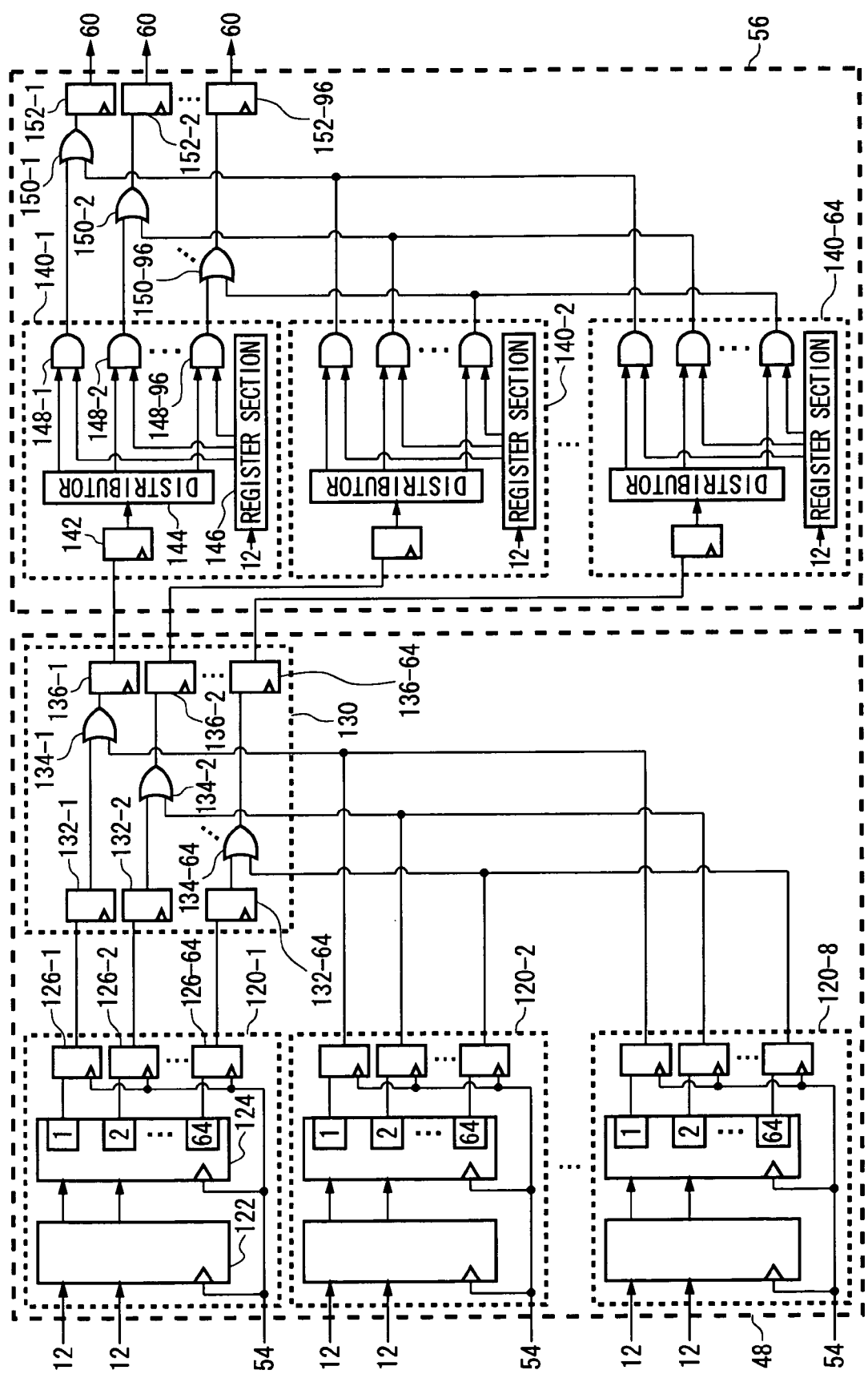
FIG. 9 shows an example of configurations of the generating circuit 48 and timing signal distributing circuit 56.

FIG. 9 shows an example of configurations of the generating circuit 48 and timing signal distributing circuit (120-1 to 120-8, hereinafter collectively referred to as buses 120) and a computing circuit 130.

The plurality of buses 120 is provided in a manner to correspond to a plurality of host computers in the controlling section 12 and each of the plurality of buses 120 is controlled by corresponding one of the plurality of host computers. Each of the buses 120 includes a flip-flop 122, a distributing circuit 124, and a plurality of flip-flops (126-1 to 126-64, hereinafter called collectively flip-flops 126).

The distributing circuit 124 has 64 pieces of output ports and outputs a rating signal supplied from the controlling section 12 through the flip-flop 122, according to a reference clock supplied from the phase adjusting circuit 50 from one of the 64 pieces of the output ports or a plurality of output ports. Moreover, the distributing circuit 124 is provided with a control signal from the controlling section 12 through the flip-flop 122a to exercise control as to which output port provides a rating signal. The rating signal is a signal being logical H. By changing, in turn, the output ports from which the rating signal is provided by the distributing circuit 124 according to a reference clock, a plurality of timing signals each having a different phase can be generated and output. For example, by sequentially changing the output ports from which the rating signal is output by the distributing circuit 124 from the output port 1 to the output port 64 according to the reference clock, timing signals of 64 kinds, each of which has the same phase resolution as that of the reference clock and having a different phase, can be generated. In addition, by selecting each of the output ports in a desired period, a timing signal having any period can be generated. For example, by changing a period in which the output port is selected for each of the buses 120, a plurality of timing signals each having a different period can be generated for each of the buses 120. The period in which the output port is selected can be easily changed by changing a period of a control signal supplied from the controlling section 12.

The computing circuit 130 includes a plurality of flip-flops (132-1 to 132-64, hereinafter collectively referred to as flip-flops 132), a plurality of OR circuits (134-1 to 134-64, hereinafter collectively referred to as OR circuits 134), and a plurality of flip-flops (136-1 to 136-64, hereinafter collectively referred to as flip-flops 136).

The plurality of flip-flops 132, plurality of OR circuits 134, and plurality of flip-flops 136 is provided in a manner to correspond to the output ports and receive timing signals to be output from the corresponding output ports. The OR circuit 134 receives a timing signal output from the output port corresponding to the distributing circuit 124 in each of the buses 120 and outputs a logical sum of each of the received timing signals. The controlling circuit 12 exclusively controls each of a plurality of distributing circuits 124 so that the plurality of distributing circuits 124 does not output the timing signals simultaneously from the same output port. For example, which output port, out of the output ports 1 to 64 of the distributing circuits 124, is to be controlled by the plurality of host computers, is determined in advance. Each of the host computers selects, in turn, the output port from which a timing signal is output, out of the predetermined output ports in the distributing circuits 124 corresponding to the buses 120. Moreover, each of a plurality of flip-flops 136 supplies each timing signal to the timing signal distributing circuit 56 in synchronization.

The timing signal distributing circuit 56 includes a plurality of distributing sections (140-1 to 140-64, hereinafter collectively referred to as distributors 140), a plurality of OR circuits (150-1 to 150-96, hereinafter collectively referred to as OR circuits 150), and a plurality of flip-flops (152-1 to 152-96, hereinafter collectively referred to as flip-flops 152).

The plurality of distributing sections 140 is provided in a manner to correspond to a plurality of output ports in the distributing circuits 124 and receives a timing signal output by corresponding output ports. Each of the distributing sections 140 includes a flip-flop 142, a register section 146, a plurality of AND circuits (148-1 to 148-96, hereinafter collectively referred to as AND circuits 148).

The distributor 144 receives a timing signal through the flip-flop 142 and distributes the timing signal to each of the AND circuits 148. Each of the AND circuits 148 is provided in a manner to correspond to each of a plurality of timing supplying sections 60 and outputs a logical product of the received timing signal and a signal supplied from the register section 146.

The register section 146 stores command data indicating which one of the timing supplying sections 60 is to receive the timing signal. In the embodiment, the register section 146 stores plural bits of command data, each bit corresponding to any one of the plurality of timing supplying sections 60. To the register section 146 is provided with the command data from the controlling section 12. The controlling section 12 makes the register section 146 save command data containing a bit being logically H which corresponds to each of the timing supplying sections 60 that has to supply the timing signal.

Moreover, a plurality of OR circuits 150 is provided in a manner to correspond to a plurality of AND circuits 148 and, in each of the plurality of distributing sections 140, a logical sum of the timing signal output by each of the corresponding AND circuits is output. The controlling section 12, in each of the distributing sections 140, makes each of the register sections 146 save command data so that each of the AND circuits 148 corresponding to each of the same timing supplying sections 60 does not output timing signals simultaneously. That is, command data being saved in each of the register sections 146 is supplied in a manner in which same bits are not simultaneously H.

A plurality of flip-flops 152 is provided in a manner to correspond to a plurality of OR circuits 150 and synchronizes the timing signal and supplies the timing signal to corresponding timing supplying sections 60.

As described above, according to the generating circuit 48 of the embodiment, it is possible to generate a plurality of timing signals having a resolution being equal to that of a period of the reference clock and whose phase and frequency can set in a predetermined way. Moreover, according to the timing signal distributing circuit 56 of the embodiment, any one of a plurality of timing signals generated by the generating circuit 48 can be arbitrarily selected to supply the selected signal to each of the timing supplying sections 60.

Figure 10:
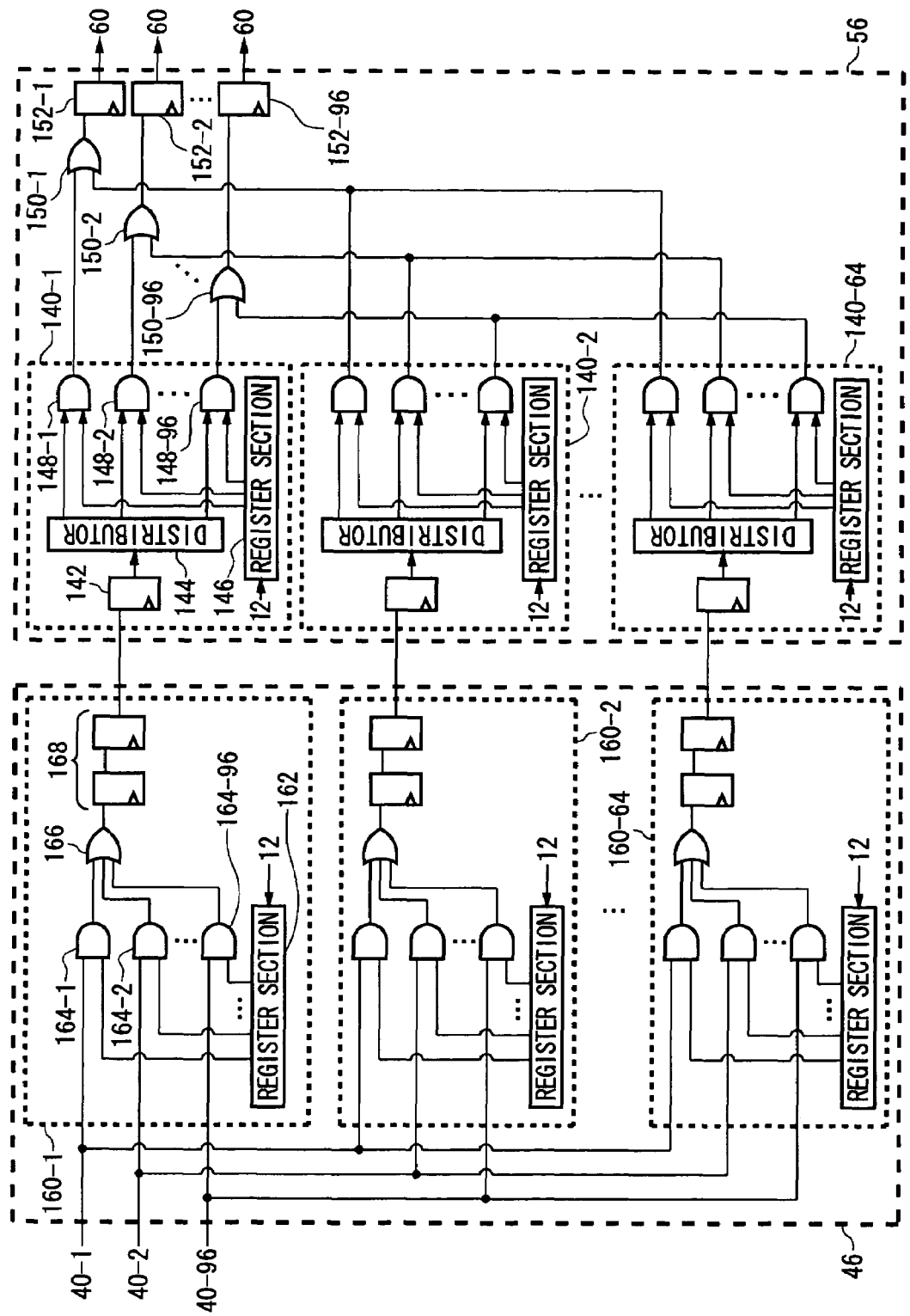
FIG. 10 shows an example of configurations of the compiling circuit 46, timing signal distributing circuit 56.

FIG. 10 shows an example of configurations of the compiling circuit 46 and timing signal distributing circuit 56. In the embodiment, the timing signal distributing circuit 56 has the same configurations as those of the timing signal distributing circuit 56 described in FIG. 9.

The compiling circuit 46 has a plurality of compiling sections (160-1 to 160-64, hereinafter collectively referred to as compiling sections 160). The plurality of compiling sections 160 is provided in a manner to correspond to a plurality of distributing sections 140 in the timing signal distributing circuit 56. Each of the compiling sections 160 includes a register section 162, a plurality of AND circuits (164-1 to 164-96, hereinafter collectively referred to as AND circuits 164), an OR circuit, and a shift register section 168, receives fail timing signals output from a plurality of feedback system circuits 40 and outputs a logical sum of two or more fail timing signals out of a plurality of fail timing signals. Moreover, the plurality of distributing sections 140 in the timing signal distributing circuit 56 is provided in a manner to correspond to the plurality of compiling sections 160 and distributes results from computation by corresponding compiling sections 160 to the plurality of test modules 14.

The plurality of AND circuits 164 is provided in a manner to correspond to the plurality of feedback system circuits 40 and receives fail timing signals or a like output from the corresponding feedback system circuits 40. Then, a logical product of the received fail timing signals and signals supplied from the register section 162 is output. The OR circuit 166 outputs a logical sum of fail timing signals output from the plurality of AND circuits 164.

In the register section 162 is stored command data indicating which fail timing signal, out of the plurality of fail timing signals, produces an OR that is to be output to the OR circuit 166. In the embodiment, the register section 162 stores a plurality of bits making up the command data, each of the plurality of bits corresponding to each of the plurality of feedback system circuits 40. To the register section 162 is provided with the command data from the controlling section 12. The controlling section 12 makes the register section 162 save command data containing a bit being logically H which corresponds to a fail timing signal to be supplied to the OR circuit 166.

In the embodiment, the controlling section 12 makes the register section 162 in each of the compiling sections 160 corresponding to each of the distributing sections 140 save the same command data as has been stored in the register section 146 in each of the distributors 140. That is, the controlling section 12 makes the timing signal obtained based on the fail timing signal be supplied to all the test modules 14 when any one of the plurality of test modules 14 to be grouped by the command data saved in the register section 146 generates a fail timing signal.

Alternatively, each of the distributing sections 140 and compiling sections 160, both corresponding to one another may have a register that can be used commonly. For example, each of the compiling sections 160 may receive command data from each of corresponding one of the distributing sections 140. This can reduce the number of register elements in the test apparatus 100.

Figure 11A:
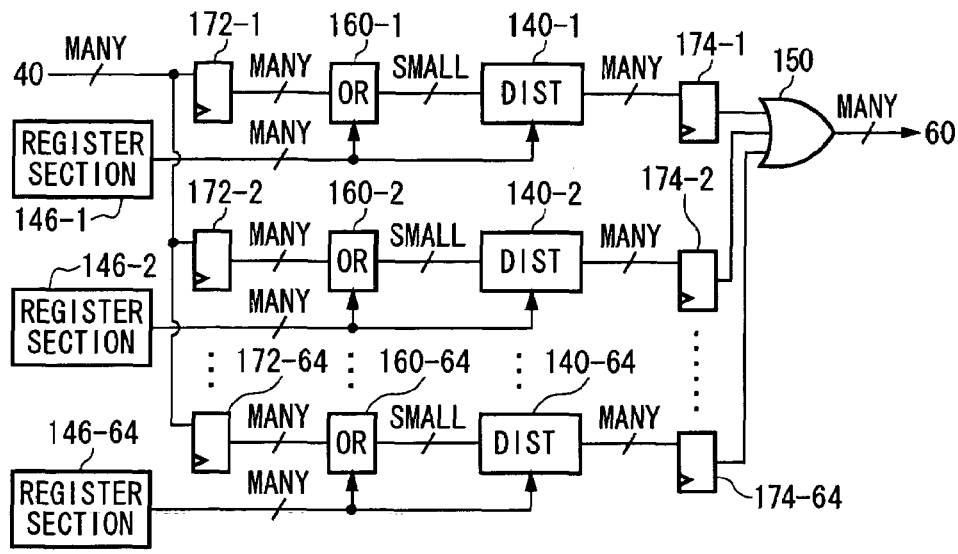
Figure 11B:
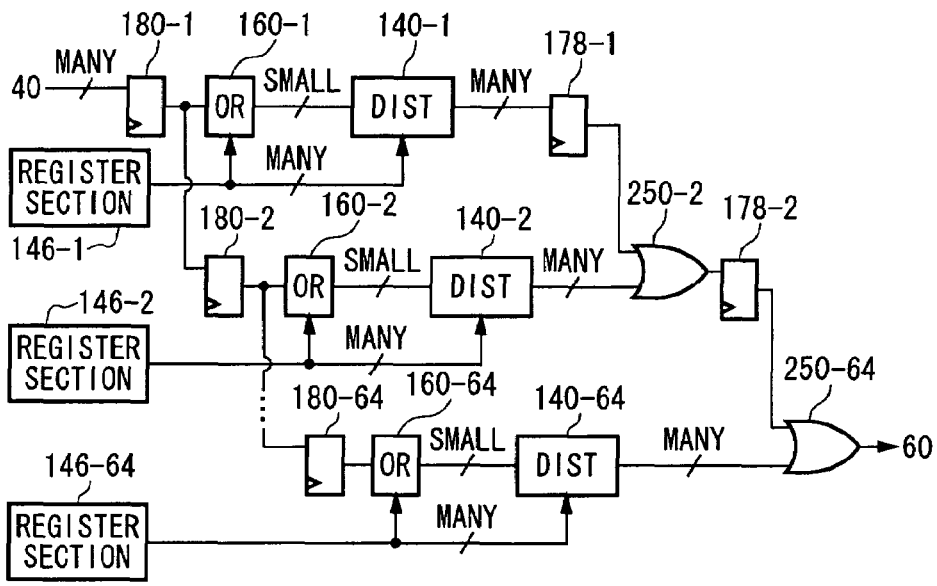
Figure 11C:
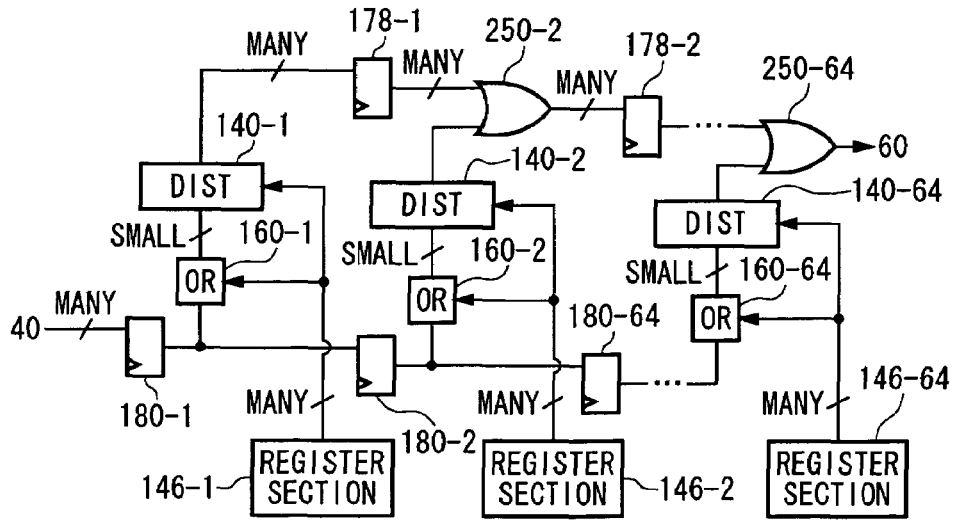

FIGS. 11A–C show examples of arrangements on a semiconductor substrate (not shown) in the plurality of compiling sections 160 and the distributing sections 140. FIGS. 11A–C are diagrams showing examples of arrangements of each of the compiling sections 160 and each of the distributing sections 140.

As shown in FIG. 11A, the compiling sections 160 and the corresponding distributing sections 140 being combined with one another are provided in parallel on the semiconductor substrate. Moreover, the compiling circuit 46 further has a plurality of flip-flops (172-1 to 172-64, hereinafter collectively referred to as flip-flops 172) provided in a manner to correspond to the plurality of compiling section 160. The plurality of flip-flops 172 supplies a plurality of fail timing signals received from the feedback system circuits 40, in a synchronous manner, to the plurality of compiling circuits 46.

Moreover, the timing signal distributing circuit 56 further has a plurality of flip-flops (174-1 to 174-64, hereinafter collectively referred to as flip-flops 174) provided in a manner to correspond to the plurality of distributing sections 140. The plurality of flip-flops 174 supplies a plurality of fail timing signals received from the corresponding distributing section 140 to the OR circuit in a synchronous manner. By configuring as above, processing of each of the compiling sections 160 and the distributing sections 140 can be performed according to a pipeline processing method in a synchronous manner.

Also, as shown in FIG. 11B, the compiling section 46 may have a plurality of flip-flops (180-1 to 180-64, hereinafter collectively referred to as flip-flops 180) being provided in a manner to correspond to a plurality of compiling sections 160. The plurality of flip-flops 180 is cascaded and supplies fail timing signals, in turn, to corresponding one of the compiling circuit 46. That is, the fail timing signals are supplied to each of the compiling circuit 46 with different timing.

As shown in FIG. 11B, the OR circuit may be replaced with a plurality of OR circuits (250-2 to 250-64, hereinafter collectively referred to as OR circuits 250). The plurality of OR circuits 250 are provided in a manner to correspond to a plurality of distributing sections (140-2 to 140-64). The plurality of OR circuits are cascaded and each of the OR circuit 250-2 outputs a logical sum of fail timing signals output from the distributing section 140-1 and distributing section 140-2. Moreover, another OR circuit 250 produce a logical sum of the logical sum of the previous-stage OR circuit 250 and a fail timing signal output from the corresponding distributing section 140. By configuring as above, a delay in operations of the plurality of compiling circuits 46 and the plurality of timing signal distributing circuits 56 can be reduced.

Also, each of the compiling sections 160 and each of the corresponding distributing sections 140 are connected in series in a first direction on the semiconductor substrate. Although the register section 162 and register section 146 are provided in each of the compiling sections 160 and in each of the distributing sections 140 in FIG. 10, the register section 146 is provided outside of the compiling sections 160 and distributing sections 140 in the example shown in FIG. 11.

The plurality of register sections 146 is provided in a manner to correspond to the plurality of compiling sections 160 and the plurality of distributing sections 140. Plural bits of control signals to exercise control as to which fail timing signal out of the plurality of fail timing signals is used to perform a logic operation in each of the compiling sections 160 and as to which one of the test modules 14 is to receive a result from the logic operation in the distributing sections 140 is supplied to the corresponding compiling sections 160 and distributing sections 140. It is preferable that, as shown in FIG. 11B, each of the register sections 146 is connected to each of the corresponding compiling sections 160 and distributing sections 140 in a first direction.

Moreover, as shown in FIG. 11C, on the semiconductor substrate, a wiring to connect each of the compiling sections 160 to each of the test modules 14, that is, at least part of the wiring to connect each of the compiling sections 160 to the feedback system circuits 40, are preferably formed along a second direction orthogonal to the first direction. Also, on the semiconductor substrate, a wiring to connect each of the distributing sections 140 to each of the test modules 14, that is, at least part of the wiring to connect each of the distributing sections 140 to the timing supplying circuits 60, is preferably provided along a second direction orthogonal to the first direction.

By configuring as above, it is possible to prevent wirings requiring many signal lines from being formed in a deviated state in a horizontal or longitudinal direction on the semiconductor substrate. It is impossible to fabricate signal lines, extending in a same direction, whose number exceeds a specified number on the semiconductor substrate, however, according to the embodiment, signal lines can be efficiently distributed both in horizontal and longitudinal directions.

Figure 12:
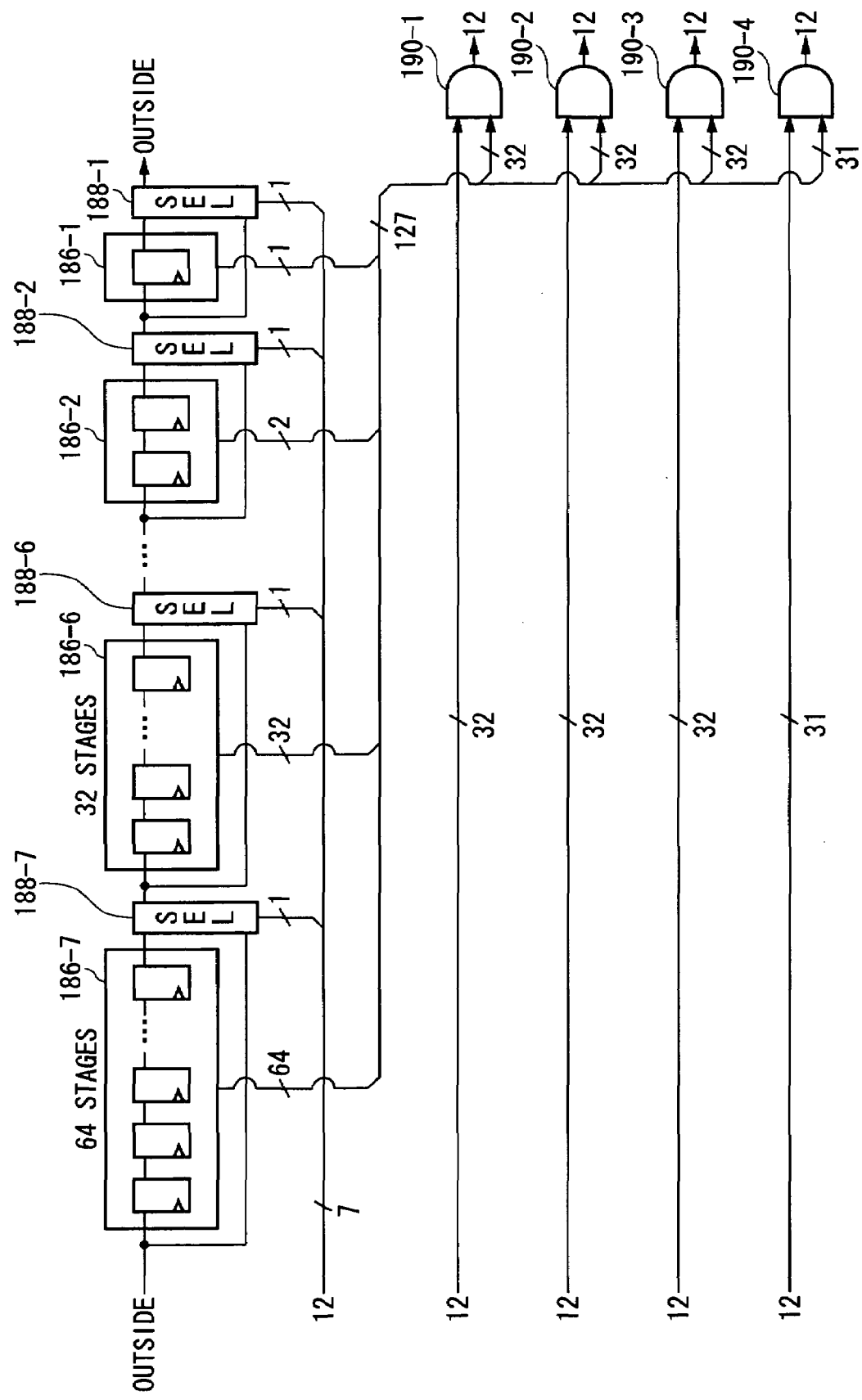
FIG. 12 shows an example of configurations of a plurality of flip-flop sections (186-1 to 186-7, hereinafter collectively referred to as flip-flops 186) and a plurality of selecting sections (188-1 to 188-7, hereinafter collectively referred to as flip-flops 188).

FIG. 12 shows an example of configurations of a plurality of flip-flop sections (186-1 to 186-7, hereinafter collectively referred to as flip-flops 186) and a plurality of selecting sections (188-1 to 188-7, hereinafter collectively referred to as flip-flops 188). Each of the plurality of flip-flops (42, 52, and 62) described with reference to FIG. 3 may have the same configurations as those of each of the flip-flops 186. Each of the timing selecting section 54, feedback signal selecting section 44, and timing signal selecting section 64 described with reference to FIG. 3 may have the same configurations as those of the plurality of selecting sections 188 to be described by referring to FIG. 12.

The plurality of flip-flops making up the flip-flop sections 186 are cascaded and each of the flip-flop sections 186 has flip-flops being cascaded. Each of the flip-flop sections 186 receives a reference clock to be input, timing signal, fail timing signal, or a like and each of the cascaded flip-flops passes, in turn, the received signal, according to the reference clock, to a next-stage flip-flop.

It is preferable that the number of cascaded flip-flops in each of the flip-flop sections 186 is different. For example, each of the flip-flop sections 186-m has flip-flops being cascaded in $2^{m-1}$ stages. Then, each of the plurality of selecting sections 188 is provided in a manner to correspond to each of the plurality of flip-flop sections 186, selects either of a signal to be input to corresponding one of the flip-flop sections 186 or a signal output from corresponding one of the flip-flops 186, and supplies the selected signal to a next-stage one of the flip-flop sections 186. The controlling section 12 exercises control on which signal is to be selected by each of the selecting sections 188. By configuring as above, easy control can be exercised so that a reference clock, timing signal, fail timing signal, or a like pass through a desired number of flip-flops.

Each of the feedback system circuits 40, phase adjusting circuit 50, and each of the timing supplying sections 60 further has a means to read a value stored on each of the plurality of flip-flops (42, 52, and 62). For example, as shown in FIG. 12, they further may have a plurality of AND circuits 190. The plurality of AND circuits 190 receives a value stored on each of the flip-flops and, according to a control signal supplied from the controlling section 12, supplies the value stored on each of the flip-flops to the controlling sections 12.

Figure 13:
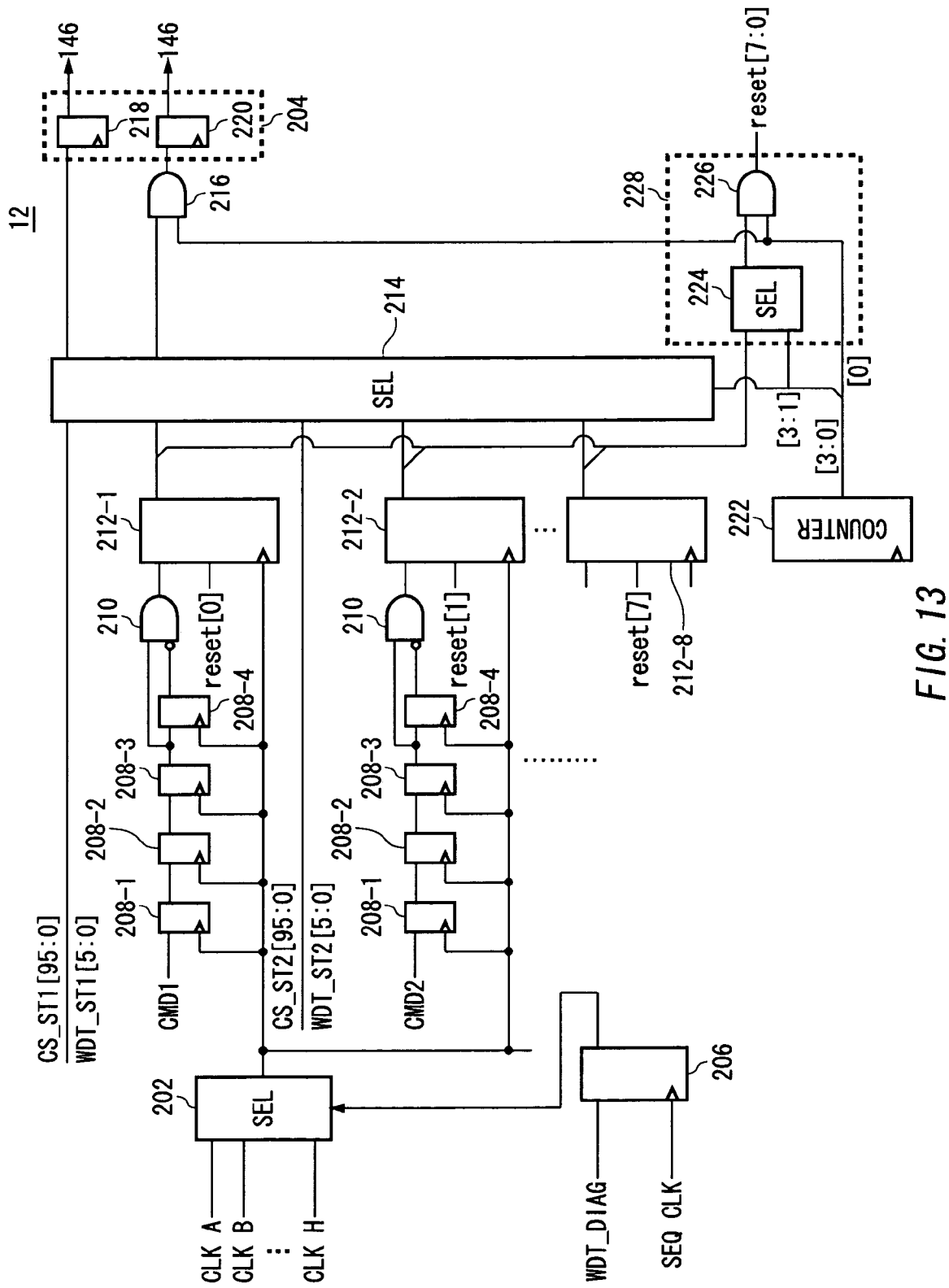
FIG. 13 shows an example of configurations of a writing controlling circuit to control a plurality of register sections 146 in the controlling section 12.

FIG. 13 shows an example of configurations of a writing controlling circuit to control a plurality of register sections 146 in the controlling section 12. The writing controlling circuit includes a plurality of request signal storing sections (212-1 to 212-8, hereinafter collectively referred to as request signal storing sections 212), a selector 202, a flip-flop 206, a plurality of flip-flops (208-1 to 208-4, hereinafter collectively referred to as flip-flops 208), a plurality of AND circuits 210, a counter 222, an AND 216, and a writing section 204.

The selector 202 is provided for selecting internal clocks (CLKA–CLKH) of a plurality of host computers installed in the control unit 12, selects one of internal clocks, and is used for a clock for writing control circuits. To the selector 202 is provided with a selection controlling signal from the flip-flop 206 and any one of clocks is selected according to the selection controlling signal.

The flip-flop 206 the flip-flop 206 stores a selection controlling signal. The selection controlling signal is a signal to make any one of internal clocks to be supplied to the selector 202 from the host computer be selected.

The plurality of request signal storing sections 212 is provided in a manner to correspond to a plurality of host computers and stores a writing request signal supplied from corresponding one of the host computers. In the embodiment, the writing request signal is a logical H signal indicating which register section 146 writes command data. Each of the request signal storing sections 212 receives a writing request signal through the plurality of flip-flops 208 and the AND circuit 210. Each of the plurality of flip-flops (208-1 to 208-3) removes a so-called meta-stable caused by the inconsistency of the clock synchronized with a writing demand signal and the clock for the writing control circuits. Therefore, it is necessary to make the period of the writing demand signal to be input to be longer than the period of the internal clocks (CLKA–CLKH).

Moreover, the flip-flop 208-4 and the AND circuit 210 are provided to supply a writing control signal only during one cycle of the selected internal clock from a rising edge of a predetermined writing control signal to corresponding one of the request signal storing sections 212.

The host selecting section 214 sequentially selects a plurality of request signal storing sections 212, receives data stored in the selected request signal storing section 212 and outputs the data. The counter 222 sequentially generates a plurality of host specifying signals each indicating one of the plurality of request signal storing sections 212 and supplies the signal to the host selecting section 214, and the host selecting section 214 sequentially selects the request signal storing sections 212 specified by the host specifying signal being received in turn. The counter 222 sequentially generates binary numbers having, for example, a number including a zero to a number being twice as many as the number of the plurality of request signal storing sections 212 and outputs data obtained by removing the least significant bit from the generated binary numbers as a host specifying signal. In the embodiment, the writing controlling circuit has eight request signal storing sections 212 and the counter 222 generates, in turn, binary numbers including 0000 to 1111 in ascending order.

Moreover, the host selecting section 214 receives command data (CS_ST1 to CS_ST8) to be written in a manner to correspond to a writing request signal and register section specifying data (WDT_ST1 to WDT_ST8) used to identify a register section 146 into which the command data has to be written from each of the host computers and supplies the command data and register section identifying data both being received from one of the host computers corresponding to selected one of the request signal storing sections 212 to the writing section 204.

The writing section 204 receives stored data output from the host selecting section 214, command data to be written to each of the register sections 146, and register section identifying data to identify any one of the register sections 146 to which the command data has to be written and, when the received stored data is a writing request signal, writes the command data to each of the register sections 146 to be specified by the register section identifying data. The writing section 204 has a flip-flop 218 and a flip-flop 220. The flip-flop 218 supplies the command data to each of the register sections 146 to be identified by the register section identifying data. The flip-flop 220 outputs a write enable signal that allows writing to the register sections 146.

The resetting section 228 resets a writing request signal being stored on the request signal storing section 212 selected by the host selecting section 214 when the stored data received by the host selecting section 214 is a writing request signal. For example, the resetting section 228 receives a plurality of pieces of data being stored on the plurality of request signal storing sections 212 and a host identifying signal generated by the counter section, and when data being stored on the request signal storing section 212 corresponding to the host identifying signal is a writing request signal, it resets the writing request signal being stored in the request signal storing section 212 to be identified by the host specifying signal.

The resetting section 228 has a selector 224 and an AND circuit 226. The selector 224 receives 8-bit signal representing data being stored in each of the plurality of request signal storing sections 212, and when a bit identified by the host identifying signal contained in the received signal is logically H, it supplies a reset signal, in which only the bits concerned are made to be logically H, to the AND circuit 226. The AND circuit 226 receives the least significant bit making up the binary number generated by the counter 222, and when the least significant bit making up the binary number generated by the counter 222 is logically H, it supplies a reset signal to each of the request signal storing sections 212 and resets one of the request signal storing sections 212 corresponding to a position of a bit providing a logical H that constitutes a reset signal.

Moreover, when the least significant bit making up the binary number generated by the counter 222 is logically H, the AND circuit 216 supplies the stored data output from the host selecting section 214 to the flip-flop 220 in the writing section 204.

According to the writing control circuit of the embodiment, it is possible to efficiently re-write command data stored in each of the register sections 146. Moreover, since command data can be re-written by any one of the plurality of host computers, the register sections 146 can be used commonly by the plurality of host computers. For example, which host computer uses each of the register sections 146 can be determined in every test and the number of register elements in the test apparatus can be reduced.

Although the present invention has been described by way of exemplary embodiments, it should be understood that many changes and substitutions may be made by those skilled in the art without departing from the sprit and the scope of the present invention which is defined only the appended claims.

INDUSTRIAL APPLICABILITY

According to the present invention, since there is no need of having a register for every plural host computers, the number of the registers in the test apparatus can be reduced. Moreover, data can be efficiently written on the registers.

What is claimed is:

1. A writing control circuit for writing command data supplied from a plurality of host computers onto a plurality of register sections, comprising:

a plurality of request signal storing sections corresponding to said plurality of host computers for storing writing request signals from said plurality of host computers;

a host selecting section to sequentially select said plurality of request signal storing sections and to receive and output store data being stored on the selected request signal storing sections; and a writing section to receive
the stored data output from said host selecting section,
command data to be written onto said plurality of register sections, and
register section specifying data used to specify said plurality of register sections onto which the command data is to be written,
and to write command data onto said plurality of register sections specified by said register section specifying data when the stored data received is the writing request signal.

2. The writing control circuit as claimed in claim 1, wherein said host selecting section receives
the command data to be written corresponding to the writing request signals, and
register section specifying data to specify said register sections onto which the command data is to be written,
and supplies the command data received from said plurality of host computers corresponding to said plurality of request signal storing sections and the register section specifying data to said writing section.

3. The writing control circuit as claimed in claim 2, further comprising:
a resetting section to reset the writing request signal being stored on said plurality of request signal storing sections selected by said host selecting section when the stored data received from said host selecting section is the writing request signal.

4. The writing control circuit as claimed in claim 3, further comprising:
a counter section to sequentially generate a plurality of host specifying signals indicating said plurality of request signal storing sections and to supply the generated signals to said host selecting section,
wherein said host selecting section sequentially selects said plurality of request signal storing sections to be specified by the host specifying signals being received in order.

5. The writing control circuit as claimed in claim 4, wherein said resetting section receives the stored data being stored on said plurality of request signal storing sections and the host specifying signals generated by said counter section, and resets the writing request signals being stored on said request signal storing sections and being specified by the host specifying signals when the stored data being stored on said plurality of request signal storing sections are the writing request signals.

6. The writing control circuit as claimed in claim 5, wherein said counter section sequentially generates binary numbers from zero up to a number twice the number of said plurality of request signal storing sections and supplies data obtained by removing the least significant signal from the generated binary numbers, as the host specifying signal, to said host selecting section and said resetting section,
said writing control circuit further comprises an AND circuit that supplies the stored data output from said host selecting section to said writing section when the least significant signal generated by said counter section is logically high, and said resetting section resets the writing request signal being stored on said plurality of request signal storing section to be specified by the host specifying signal when the stored data received by said host selecting section is the writing request signal and the least significant signal of the host specifying signal is logically high.

7. A test apparatus for testing electronic devices, comprising:

a reference clock generating section to generate a reference clock;

a plurality of test modules to apply test pattern signals to be used for testing the electronic devices to the electronic devices according to predetermined clocks;

a plurality of distributing circuits to generate timing signals each having a different phase according to the reference clock and to distribute the generated timing signals to one of or among said plurality said test modules;

a plurality of register sections corresponding to said plurality of distributing circuits for storing command data indicating one of or said plurality of test modules among which the corresponding distributing circuits are to distribute the timing signals; and a writing control circuit to write each of said command data supplied from a plurality of host computers onto any of said plurality of register sections, wherein said writing control circuit comprises:

a plurality of request signal storing sections corresponding to said plurality of host computers for storing writing request signals supplied from the corresponding host computers;

a host selecting section to sequentially select said plurality of request signal storing sections and to receive and output data being stored on the selected request signal storing sections; and a writing section to receive the stored data output by said host selecting section, command data to be written onto said plurality of register sections, and register section specifying data to specify said register sections onto which the command data is to be written, and to write the command data onto said register sections to be specified by the register section specifying data when the stored data received is the writing request signal.

8. The test apparatus as claimed in claim 7, wherein said host selecting section receives the command data to be written according to the writing request signal from each of said plurality of host computers, supplies the command data received from said plurality of host computers corresponding to said selected request signal storing section to said writing section.

9. The test apparatus as claimed in claim 8, wherein said writing control circuit further comprises a resetting section to reset the writing request signal being stored on said request signal storing section selected by said host selecting sections, when the stored data received by said host selecting section is the writing request signal.

\* \* \* \* \*